United States Patent
Tsuruko

(10) Patent No.: US 8,088,435 B2
(45) Date of Patent: Jan. 3, 2012

(54) MASK, METHOD FOR PRODUCING MASK, AND METHOD FOR PRODUCING WIRED BOARD

(75) Inventor: Masanori Tsuruko, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 1118 days.

(21) Appl. No.: 11/277,921

(22) Filed: Mar. 29, 2006

(65) Prior Publication Data

US 2006/0222965 A1 Oct. 5, 2006

(30) Foreign Application Priority Data

Mar. 30, 2005 (JP) ................................. 2005-099520

(51) Int. Cl.
*B05D 5/12* (2006.01)
(52) U.S. Cl. ........................ 427/98.4; 427/97.3; 427/282
(58) Field of Classification Search .................. 427/98.4, 427/97.3, 282
See application file for complete search history.

(56) References Cited

U.S. PATENT DOCUMENTS

| | | | |
|---|---|---|---|
| 4,049,857 A | | 9/1977 | Hammer |
| 4,273,812 A | * | 6/1981 | Tsutsui et al. .............. 427/96.8 |
| 5,154,797 A | * | 10/1992 | Blomquist et al. .............. 216/12 |
| 7,033,665 B2 | * | 4/2006 | Yotsuya et al. ............... 428/131 |
| 2004/0214449 A1 | | 10/2004 | Yotsuya et al. | |

FOREIGN PATENT DOCUMENTS

| | | |
|---|---|---|
| EP | 1441572 A1 | 7/2004 |
| JP | H10-330910 A | 12/1998 |
| JP | H10-330911 A | 12/1998 |
| JP | 2001 254169 | 9/2001 |
| JP | 2004-225071 A | 8/2004 |

OTHER PUBLICATIONS

European Patent Office, European Search Report for Related EP Application No. 06006552 dated Nov. 3, 2006.
Japan Patent Office, Notice of Reasons for Rejection for Japanese Patent Application No. 2006-091127 (counterpart to above-captioned patent application), mailed Nov. 30, 2010.

* cited by examiner

*Primary Examiner* — Brian K Talbot
(74) *Attorney, Agent, or Firm* — Baker Botts L.L.P.

(57) ABSTRACT

A mask, through which a plurality of slender through-holes are formed, has a reinforcing section which is formed to span the through-holes, wherein recesses are provided at portions of the reinforcing section to cover the through-holes. Accordingly, a metal, which is subjected to the sputtering, easily makes the detour around the reinforcing section. Therefore, a metal film is easily formed even on portions shadowed by the reinforcing section. It is possible to accurately form a fine wiring pattern.

18 Claims, 16 Drawing Sheets

MASK, METHOD FOR PRODUCING MASK, AND METHOD FOR PRODUCING WIRED BOARD

BACKGROUND OF THE INVENTION

1. Field of the Invention

The present invention relates to a mask for masking a non-wiring area on a board or substrate in order to form a fine metal wiring on the board, for example, by means of the vapor deposition, and a method for producing the mask. The present invention also relates to a method for producing a wired board by forming a wiring on a board by using the mask.

2. Description of the Related Art

In order to form metal wirings on a board or substrate, a film of metal is formed and processed on the surface of the board. The method for processing the metal includes, for example, the subtractive method, the additive method, and the lift-off method. In the case of the subtractive method, a metal film is previously formed on the entire surface of the board, for example, by means of the sputtering method. A resist pattern is formed on portions to be converted into wirings, and unnecessary portions are removed, for example, by means of the etching. In this method, the accuracy of the formed wiring is affected by the accuracy of the etching. Therefore, this method involves such a drawback that it is difficult to apply this method to the formation of fine wirings. In the case of the additive method, a resist pattern is formed on portions of the board surface on which any wiring is unnecessary. A metal film is formed on only portions at which the resist is absent. In this method, the accuracy of the formed wiring is determined by the accuracy of the resist pattern. Therefore, it is possible to form fine wirings. However, this method involves such a problem that when a plating film or the like is formed, then the heat tolerance of the film is weak, and the reliability is low.

In the case of the lift-off method, a resist pattern is formed at portions at which no wiring is required. A metal film is formed on the entire surfaces of the board and the resist, for example, by means of the sputtering method. After the film formation, the resist and the metal film on the resist surface are exfoliated to form the wiring. In this method, it is possible to form the fine wiring. Additionally, it is possible to form the metal film having the high heat tolerance by means of the sputtering method with ease. It is possible to solve both of the problem concerning the accuracy involved in the subtractive method and the problem concerning the heat tolerance of the film involved in the additive method. However, it is necessary that the resist pattern, which has a complicated cross-sectional shape, should be formed so that the resist and the metal film on the resist surface can be reliably exfoliated. This method involves such a problem that the number of production steps is consequently increased, and the production cost is consequently increased.

On the other hand, the mask film formation method is known, which uses a mask formed with openings corresponding to a wiring pattern without using the resist to form wirings. In the case of this method, the mask, which has the openings corresponding to the wiring portions, is allowed to make tight contact with a board surface. A metal film is formed on the entire surfaces of the mask and the board. After the film formation, the mask is detached to form the wirings. The accuracy of the formed wiring is determined by the accuracy of the mask. Therefore, it is possible to form the fine wirings in the same manner as in the lift-off method. When the sputtering method or the like is used, it is possible to form the metal film having the high heat tolerance. When the strength of the mask is high, it is possible to reuse the mask. Therefore, an advantage is obtained such that the production cost can be reduced.

However, the mask film formation method has involved the following problem. That is, for example, when a plurality of long linear wirings, which have a wiring width of about 2 μm and a length of about 2 mm and which are in a form of being aligned in parallel, are formed, there is given, for example, a state in which the tight contact of the mask with respect to the board is unstable, for example, a state in which any strain arises at portions of the parallel wirings, or the mask is in a floating situation without making the tight contact with the board. It is feared that any error may arise in the width of the wiring to be formed. It is feared that the wiring may be broken or the wiring may make contact with the adjacent wiring depending on the degree of the error.

Japanese Patent Application Laid-open No. 2001-254169 describes a mask having a wiring pattern composed of long linear wirings aligned in parallel. In the case of this mask, a fine rib, which spans a plurality of wiring patterns, is provided on the surface on the side opposite to the side on which the mask is stuck to the board, in order to reinforce the mask. In this way, it is intended that any strain is prevented from being generated at the portions of the parallel wirings.

However, when the rib, which spans the plurality of wiring patterns, is provided as in the mask described in Japanese Patent Application Laid-open No. 2001-254169, it is necessary that the film formation should be performed on the board surface while making the detour or bypass around the rib. Therefore, it is desirable that the distance between the board surface and the rib is long or separated. However, in order to increase the distance between the board surface and the rib, it is necessary that the mask body should be thickened. A problem arises such that it is difficult to form any fine wiring, because the film formation is hardly performed when the mask body is thickened.

In the case of the mask described in Japanese Patent Application Laid-open No. 2001-254169, the mask is formed by depositing a metal by means of the electroforming. Therefore, the mask body is made of the metal. When such a mask is used to form the metal wiring, then a problem arises such that it is difficult to reuse the mask, for the following reason. That is, it is feared that the mask body may be dissolved, because the metal film is exfoliated with a strong acid solution such as aqua regia or nitric acid when the metal film, which is formed on the mask surface, is exfoliated. It is feared that the opening portions of the mask for forming the wiring pattern may be buried by the metal film if the mask is reused without exfoliating the metal film formed on the mask surface.

SUMMARY OF THE INVENTION

The present invention has been made taking the foregoing circumstances into consideration, an object of which is to provide a mask which makes it possible to accurately form a fine wiring, a method for producing such a mask, and a method for producing a wired board by forming a wiring on a board by using such a mask.

According to a first aspect of the present invention, there is provided a mask comprising a flat plate-shaped mask body which is formed with a plurality of through-holes, and a reinforcing section which is arranged on one surface of the mask body so as to straddle over the through-holes and which reinforces the mask body, wherein; a length between a surface of the mask body on a side opposite to the one surface of the mask body and a surface of the reinforcing section facing the through-holes is longer than a thickness of the mask body.

The reinforcing section may have a recess which is formed at a portion of the reinforcing section which covers an opening of each of the through-holes, and an area, which is defined by the recess, is communicated with the through-holes.

According to the first aspect of the present invention, the mask is provided with the reinforcing section which is arranged to span the through-holes for forming the wiring pattern formed on the mask body. The recess is provided, for example, at the portion of the reinforcing section to cover the through-hole. Accordingly, the area, which is defined by the recess, is communicated with the through-hole. Therefore, it is possible to widen the distance between the board or substrate and the reinforcing section without thickening the mask body. For example, the wiring is formed on the board by means of the sputtering method, then the metal, which is subjected to the sputtering, can make the detour or bypass around the recess of the reinforcing section, and the metal can be also deposited on portions shadowed by the reinforcing section on the board. In this arrangement, the distance, which is provided between the reinforcing section and the board on which the wiring is formed, is determined by the depth of the recess formed for the reinforcing section irrelevant to the thickness of the mask body. Therefore, it is possible to sufficiently widen the distance between the board and the reinforcing section. The thickness of the mask body can be thinned, because the thickness of the mask body can be determined irrelevant to the reinforcing section. It is possible to form the finer wiring pattern on the mask body. Therefore, it is possible to enhance the degree of freedom of the design of the mask, and it is possible to provide a wide range of the field to which the mask is applicable. The length, which is provided between the surface of the reinforcing section allowed to face the through-hole (upper inner surface of the reinforcing section) and the surface (back surface) of the mask body disposed on the side on which the reinforcing section is not arranged, is defined so that the length is maximized. That is, for example, when the upper inner surface of the reinforcing section is not a flat surface but the upper inner surface of the reinforcing section has a concave surface shape, the length indicates the distance between the back surface of the mask and the position of the upper inner surface of the reinforcing section disposed farthest from the back surface of the mask.

In the mask of the present invention, the recess may be formed over an area overlapped with the through-holes, and an inner surface of the recess and an inner surface of the mask body defined by one of the through-holes may be continuous.

When the recess of the reinforcing section is formed over the entire area of the mask body overlapped with the through-hole, and the inner surface of the recess and the inner surface of the through-hole are allowed to form the continuous surface, then the recess and the through-hole can be formed in an identical step. Therefore, it is possible to easily form the recess of the reinforcing section, In the mask of the present invention, the mask body and the reinforcing section may be composed of silicon or a compound containing silicon.

When the mask is produced with silicon or the compound containing silicon, the metal film, which is adhered to the mask surface can be exfoliated, for example, with aqua regia or nitric acid after the metal film of the wiring is formed on the board by using the mask. Accordingly, it is possible to reuse the mask. Therefore, it is possible to reduce the cost as compared with a case in which the masking is performed with a resist pattern.

In the mask of the present invention, the mask body and the reinforcing section may be formed as an integrated body.

When the mask body and the reinforcing section are formed and integrated into one unit, for example, any positional deviation is not caused between the mask body and the reinforcing section, which would be otherwise caused when the reinforcing section is manufactured as a separate member to be adhered. Therefore, it is possible to realize the mask having the wiring pattern which is finer and more complicated. Further, it is possible to provide the recess of the reinforcing section which is difficult to be formed when the reinforcing section is manufactured as a separate member to be adhered to the mask body.

In the mask of the present invention, the plurality of the through holes formed in the mask body may be a plurality of aligned linear through-holes; and the reinforcing section may be arranged so as to straddle over the plurality of through-holes.

When the plurality of linear and slender through-holes are provided in an aligned manner for the mask body to form the wiring pattern, the wiring pattern, in which the strain or the like tends to occur, can be reinforced by arranging the reinforcing section while spanning the plurality of through-holes. Therefore, it is possible to avoid, for example, the occurrence of the wiring breaking or the short circuit formation in the wiring to be formed. It is possible to reduce the defect which would be otherwise caused during the step of forming the wiring.

In the mask of the present invention, the plurality of the through holes formed in the mask body may be a plurality of aligned linear through-holes; and the reinforcing section may include a first reinforcing member which is arranged so as to straddle over the plurality of through-holes, and a second reinforcing member which is arranged to intersect the first reinforcing member.

The wiring pattern can be reinforced more strongly by arranging the first reinforcing member to span the plurality of through-holes and arranging the second reinforcing member to intersect the first reinforcing member when the plurality of linear through-holes are provided in the aligned manner on the mask body to form the wiring pattern. Therefore, it is possible to further avoid the occurrence of, for example, the wire breaking or the short circuit formation which would be otherwise caused by the occurrence of any strain or the like in the linear wiring to be formed. It is possible to further reduce the defect which would be otherwise caused in the step of forming the wiring.

In the mask of the present invention, the reinforcing section may have a slender shape, and a portion of the reinforcing section, which is overlapped with the through-holes, may have a width smaller than a width of a portion of the reinforcing section not overlapped with the through-holes. In this arrangement, the portion, at which the reinforcing section and the through-hole are overlapped with each other, is decreased in size. Therefore, when the wiring is formed by using the mask, it is possible to decrease the rate of occurrence of the wire breaking or the like.

In the mask of the present invention, the mask body may be provided with a plurality of aligned polygonal line-shaped through-holes each of which has a bent portion; and the reinforcing section may be arranged so as to straddle over the bent portion of each of the through-holes.

When the wiring pattern is formed by providing the plurality of aligned polygonal line-shaped through-holes having the bent portions on the mask body, the polygonal line-shaped wiring pattern can be effectively reinforced by arranging the reinforcing section to span the bent portions. Therefore, it is possible to avoid the occurrence of, for example, the wire breaking or the short circuit formation in the wiring to be formed. It is possible to further reduce the defect which would be otherwise caused in the step of forming the wiring.

In the mask of the present invention, an island portion may be provided in each of the through-holes formed through the mask body; and the reinforcing section may be arranged to straddle over the through-holes and connect the mask body and the island portion of each of the through holes.

When the wiring pattern is formed by arranging the through-hole having the island-portion, then the reinforcing section is arranged by connecting the island-portion and the mask body and spanning the through-hole. Accordingly, the wiring pattern, which cannot be formed if the reinforcing section is absent, can be formed on the mask. Therefore, it is possible to form the wiring having a concentric shape or the like on the board. It is possible to increase the degree of freedom of the wiring layout, and it is possible to widen the applicable range or the applicable field of the mask.

In the mask of the present invention, the second reinforcing member may be arranged in an area substantially overlapped with the through-holes in a plan view; and a portion, at which the first reinforcing member and the second reinforcing member intersect with each other, may be formed to be thicker than other portions of the first reinforcing member and the second reinforcing member. In this arrangement, the second reinforcing member can be arranged in the area substantially overlapped with the through-hole. Therefore, it is possible to increase the degree of freedom of the position for forming the second reinforcing member.

According to a second aspect of the present invention, there is provided a method for producing a mask including a flat plate-shaped mask body which is formed with a plurality of through-holes, and a reinforcing section which is arranged so as to straddle over the through-holes and which reinforces the mask body, the method comprising: a step of providing a flat plate-shaped mask base material; a first guide pattern-forming step of forming, on one surface of the mask base material, a first guide pattern for forming the through-holes; a first etching step of performing etching, in accordance with the first guide pattern, for a portion of the one surface of the mask base material on which the first guide pattern has been formed, such that no penetration is caused through the mask base material; a second guide pattern-forming step of forming, on the other surface of the mask base material, a second guide pattern for forming the reinforcing section; and a second etching step of performing etching, for the other surface of the mask base material except for an area in which the reinforcing section is to be formed, in accordance with the second guide pattern on the other surface, such that penetration is caused through the portion of the one surface having been subjected to the etching in the first etching step.

According to the second aspect of the present invention, the first guide pattern is formed to form the through-holes on one surface of the mask base material. The etching is performed in accordance with the first guide pattern to form the wiring pattern. Further, the second guide pattern is formed to form the reinforcing section on the other surface of the mask base material. The etching is performed in accordance with the second guide pattern to form the reinforcing section. The etching is performed for the both surfaces of the mask base material, and thus the through-holes are formed through the mask body. Further, the recess is formed for the reinforcing section, and the mask body and the reinforcing section are formed in an integrated manner. As described above, the method comprises the first etching step of performing the etching on one surface of the mask base material to form the wiring pattern, and the second etching step of performing the etching on the other surface to form the reinforcing section. Accordingly, it is possible to form the recess for the reinforcing section. Therefore, it is possible to widen the distance between the reinforcing section and the board on which the wiring is formed, irrelevant to the thickness of the mask body. It is possible to reliably form the metal film of the wiring while making the detour around the recess of the reinforcing section. Further, it is possible to thin the thickness of the mask body irrelevant to the reinforcing section. Therefore, it is possible to form the finer wiring pattern.

In the method for producing the mask of the present invention, a total of etching depths effected in the first etching step and the second etching step may be greater than a thickness of the mask base material.

The depth of the recess of the reinforcing section can be easily determined by the difference between the total of the etching depths and the thickness of the mask base material, by allowing the total of the etchings depths of the etching depth effected in the first etching step and the etching depth effected in the second etching step. Accordingly, the recess can be formed with ease.

In the method for producing the mask of the present invention, each of the etching performed in the first etching step and the etching performed in the second etching step may be anisotropic etching.

When the anisotropic etching is performed as the etching performed in the first etching step and the etching performed in the second etching step, it is possible to obtain an acute cross-sectional shape of the through-hole for forming the wiring pattern on the mask. Therefore, it is possible to form the wiring pattern more accurately, and it is possible to form the finer wiring pattern, as compared with a case in which the isotropic etching, in which the cross-sectional shape tends to be, for example, semicircular, is performed.

In the method for producing the mask of the present invention, the second guide pattern-forming step may include a step of forming a first reinforcing member pattern for forming a first reinforcing member of the reinforcing section and a step of forming a second reinforcing member pattern for forming a second reinforcing member of the reinforcing section; and the second guide pattern-forming step further may include an etching step of performing etching on the one surface of the mask base material, on which the first reinforcing member pattern has been formed, in accordance with the first reinforcing member pattern such that no penetration is caused through the mask base material, the etching step being performed between the step of forming the first reinforcing member pattern and the step of forming the second reinforcing member pattern. In this procedure, it is possible to form the reinforcing section having a plurality of reinforcing members.

In the method for producing the mask of the present invention, the first reinforcing member pattern and the second reinforcing member pattern may intersect with each other. In this case, it is possible to form the reinforcing section having the higher strength.

In the method for producing the mask of the present invention, the second guide pattern-forming step further may include a step of forming a third reinforcing member pattern for forming a third reinforcing member of the reinforcing section; and the second guide pattern-forming step further may include an etching step of performing etching on the other surface of the mask base material, on which the second reinforcing member pattern has been formed, in accordance with the second reinforcing member pattern such that no penetration is caused through the mask base material, the etching step being provided between the step of forming the second reinforcing member pattern and the step of forming the third reinforcing member pattern. In this procedure, it is possible to form the third reinforcing member which reinforces the connecting portion between the first reinforcing member and the second reinforcing member. Therefore, it is possible to enhance the strength of the reinforcing section.

The method for producing the mask of the present invention may further comprise a mask area-forming step of forming a mask area for forming the plurality of through-holes by performing etching on the mask base material, the mask area-forming step being performed at least before performing the second guide pattern-forming step.

When the method comprises the mask area-forming step of forming the mask area to form the wiring pattern by previously performing the etching on the mask base material, it is possible to previously regulate the thickness of the mask base material. Therefore, the etching, which is performed on the both surfaces, is easily performed. It is possible to accurately form the through-hole and the recess of the reinforcing section.

According to a third aspect of the present invention, there is provided a method for producing a wired board by forming a wiring on the board by using a mask comprising a flat plate-shaped mask body which is formed with a plurality of through-holes, and a reinforcing section which is arranged on one surface of the mask body so as to straddle over the through-holes and which reinforces the mask body, wherein: a length between a surface of the mask body on a side opposite to the one surface of the mask body and a surface of the reinforcing section facing the through-holes is longer than a thickness of the mask body; the method comprising a positioning step of positioning the mask so that the other surface of the mask faces the board; and a wiring-forming step of forming the wiring on the board by sending material particles for forming the wiring from a side of the one surface of the mask toward the board.

The mask, which is provided, for example, with the reinforcing section having the recess to define the area communicated with the through-hole, is used for the portion to cover the through-hole. The position of the mask is determined so that the surface, which is opposite to the surface of the provision of the reinforcing section, is opposed to the surface. The material particles, which are used to form the wiring, are allowed to fly from the side of the surface of the provision of the reinforcing section, for example, by means of the sputtering method so that the material particles are deposited on the board. In this procedure, the recess is formed at the reinforcing section of the mask. The material particles also enter the portion of the board shadowed by the reinforcing section while making the detour. Therefore, it is possible to accurately form the wiring on the board.

The method for producing the wired board according to the present invention may further comprise a removing step of removing the material particles deposited on the surface of the mask.

In this procedure, the material particles, which are deposited on the mask surface, are removed after the wiring is formed on the board. Accordingly, the through-hole of the mask is not closed by the material particles. It is possible to reuse the mask. Therefore, it is possible to reduce the production cost of the wired board.

DESCRIPTION OF THE PREFERRED EMBODIMENTS

The present invention will be specifically explained below on the basis of the drawings to illustrate embodiments thereof.

First Embodiment

Figure 1:
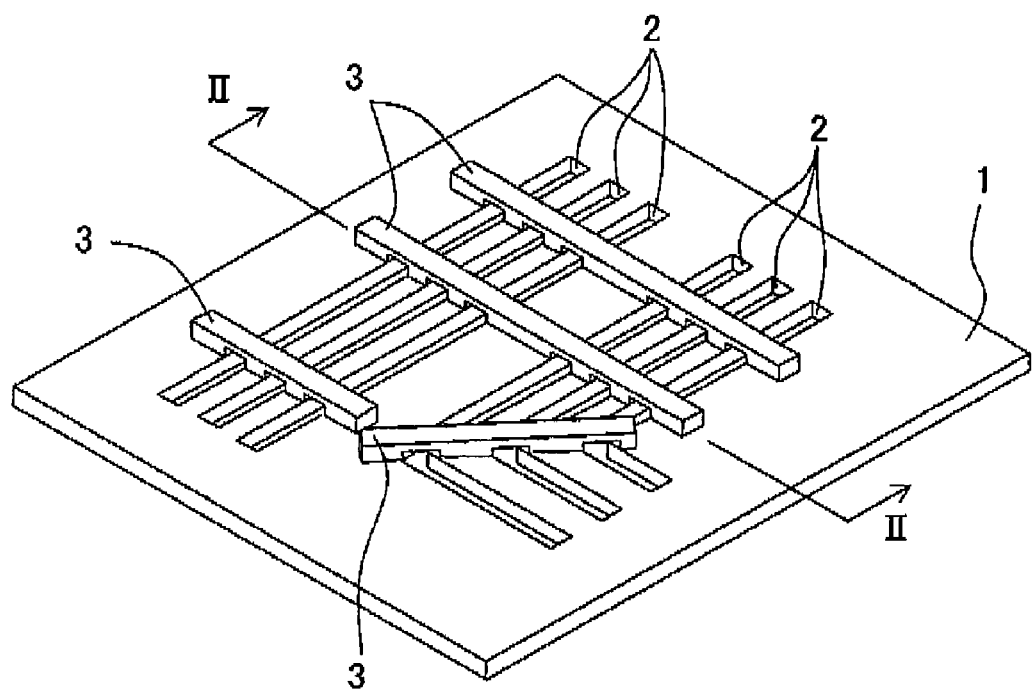
FIG. 1 schematically shows a perspective view illustrating a mask according to the present invention.
Figure 1:
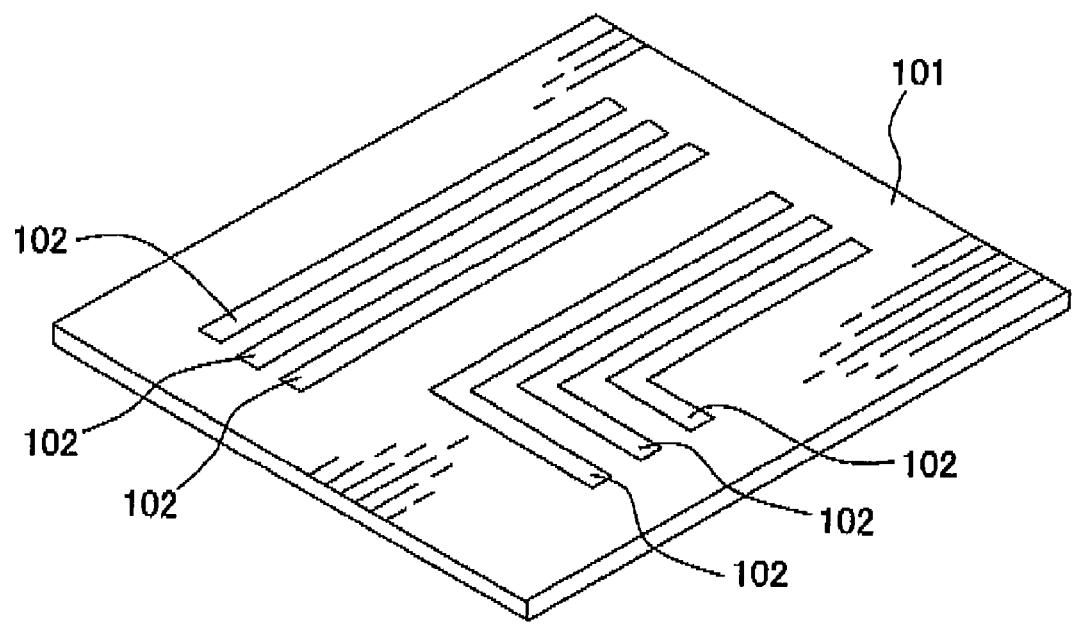
Figure 2:
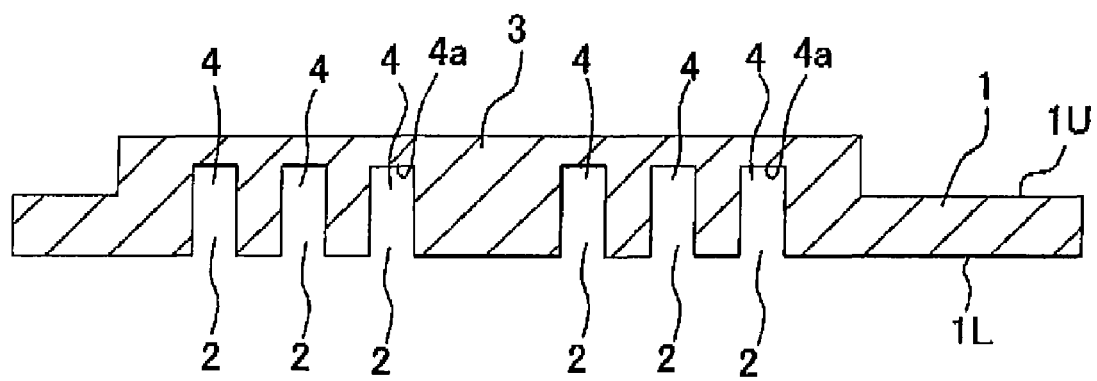
FIG. 2 shows a sectional view taken along a line II-II shown in FIG. 1.

FIG. 1 schematically shows a perspective view illustrating a mask according to the present invention. FIG. 2 shows a sectional view taken along a line II-II shown in FIG. 1. With reference to the drawings, reference numeral 1 indicates a flat plate-shaped mask body. A plurality of slender through-holes 2, which correspond to a wiring pattern of metal wirings 102 to be formed on a board 101, are formed through the mask body 1.

Parts of the plurality of slender through-holes 2 are arranged substantially in parallel to one another in the linear form. A plurality of rectangular bar-shaped reinforcing sections 3 are provided at certain intervals on the upper surface 1U of the mask body 1 so that the reinforcing sections 3 intersect the portions of the through-holes 2 arranged substantially in parallel and the reinforcing sections 3 span the respective portions. The occurrence of any strain, for example, in relation to the width of the through-hole 2 is prevented by providing the reinforcing sections 3. Subsequently rectangular recesses 4 are formed at the portions of the reinforcing sections 3 to span the through-holes 2, i.e., at the portions opposed to the areas of the mask body 1 in which the through-holes 2 are formed. The shape of the reinforcing section 3 is arch-shaped. That is, the recess 4 is formed so that the internal space thereof is communicated with the internal space of the through-hole 2. The inner surface of the recess 4 and the inner surface of the through-hole 2 are formed to provide a continuous surface. When the recess 4 is provided, it is possible to widen the spacing distance between the reinforcing section 3 and the opening portion of the through-hole 2 disposed at the lower surface 1L of the mask body 1. When the metal wiring is formed, for example, by means of the sputtering method, the sputtered metal particles easily make the detour around the reinforcing section 3.

The thickness of the mask body 1 is about 25 μm. When the mask body 1 is thin as described above, then the strain tends to occur in the mask body 1, and the mask body 1 tends to be in a floating state in which the mask body 1 does not make tight contact with the board 101. Therefore, it is feared that the wire breaking or the short circuit formation may arise in the metal wiring 102 formed on the board 101. This phenomenon is caused highly possibly as the length of the through-hole is more lengthened as compared with the width of the through-hole 2 and the spacing distance between the adjacent through-holes 2. It is empirically recognized that the inconvenience arises as described above when the length of the through-hole 2 is not less than about 2 mm, when the width of the through-hole 2 and the spacing distance between the adjacent through-holes 2 are about 10 μm. Therefore, the reinforcing sections 3 are provided for the linear aligned through-holes 2 at intervals within about 2 mm to reinforce the through-holes 2.

The thickness of the reinforcing section 3 is about 25 μm. The depth of the recess 4 is about 15 μm. The thickness of the mask body 1 is about 25 μm. Therefore, the distance, which is provided between the lower surface of the mask body 1 and the portion of the reinforcing section 3 to cover the through-hole 2, is about 40 μm. If the recess 4 is not formed for the reinforcing section 3, the distance between the reinforcing section 3 and the lower surface of the mask body 1 is about 25 μm. Therefore, the distance can be widened by about 60% by forming the recess 4. When the width of the through-hole 2 is narrower than the above, it is desirable that the distance between the lower surface 1L of the mask body 1 and the recess surface 4a of the reinforcing section 3 is widened by increasing the thickness of the reinforcing section 3 and forming the recess 4 to be deeper than the above. Owing to the arrangement in which the distance between the lower surface 1L of the mask body 1 and the recess surface 4a of the reinforcing section 3 is widened, when the metal wiring is formed on the board by using the mask, for example, by means of the sputtering method, the sputtered metal particles easily make the detour to arrive at the area on the board 101 which is overlapped with the portion of the reinforcing section 3 to cover the through-hole 2 as viewed in a plan view, i.e., the area on the board 101 which is shadowed by the reinforcing section 3.

The mask body 1 and the reinforcing section 3 are formed of a mask base material in an integrated manner. For example, silicon or a compound containing silicon is used for the mask base material. The compound containing silicon includes, for example, SiC and SiN. When silicon or the compound containing silicon or the like is used, it is not feared that the mask body 1 and the reinforcing section 3 are dissolved with any strong acid solution such as aqua regia or nitric acid.

When the metal wirings 102 are formed on the surface of the board 101 by means of the sputtering method by using the mask body 1 constructed as described above, the lower surface of the mask body 1 is allowed to make tight contact with the surface of the board 101 in a state in which the through-holes 2 are positioned at the portions of the surface of the board 101 on which the metal wirings 102 are to be formed. The mask body 1 is provided with the reinforcing sections 3 to make the intersection with respect to the linear through-holes 2. Therefore, the strain of the mask, which would be otherwise caused when the mask is allowed to make tight contact with the board 101, can be excluded. Further, it is possible to allow the mask to make tighter contact with the board 101. When the recesses 4 are formed for the reinforcing sections 3, the metal particles make the detour to arrive at the areas of the board 101 shadowed by the reinforcing sections 3 as well. Therefore, the breaking of the formed wiring 102 by the reinforcing section 3 is avoided as thoroughly as possible.

In general, the metal wiring 102 can be formed more accurately when the thickness of the mask body 1 is thinner. The detour of the metal particles around the reinforcing section 3 is effected more efficiently when the distance between the recess surface 4a of the reinforcing section 3 and the lower surface 1L of the mask body 1 is increased to make farther separation. Therefore, it is desirable to set the depth of the recess 4 within an allowable range of the mask strength so that the thickness of the mask body 1 is made as thinner as possible, and the distance between the recess surface 4a of the reinforcing section 3 and the lower surface 1L of the mask body 1 is increased to make separation as farther as possible.

The mask is formed of silicon or the compound containing silicon. Therefore, the film, which is formed by the metal particles adhered to the mask surface, can be removed by means of the wet etching treatment after the metal wirings 102 are formed on the board 101. The metal particles as described above can be removed, for example, by using aqua regia when the metal particles are made of platinum, by using aqua regia or a solution based on antimony iodide when the metal particles are made of gold, or by using a solution based on nitric acid when the metal particles are made of silver.

The reinforcing sections 3 are not limited to the provision in which the reinforcing sections 3 intersect the plurality of linear through-holes 2 disposed in the aligned manner. It is also allowable to provide other arrangements. FIGS. 3 to 10 show front views illustrating examples of the arrangement of the reinforcing sections 3 of the mask according to the present invention.

Figure 3:
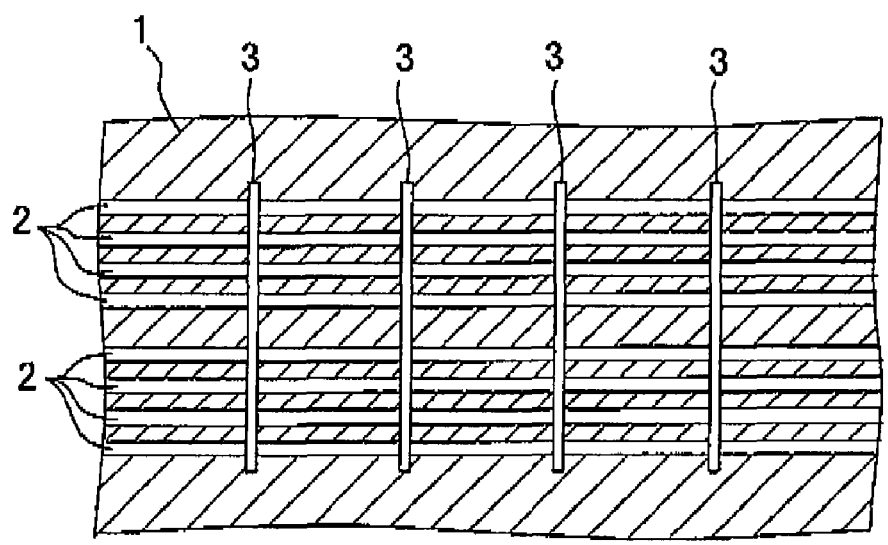
FIG. 3 shows a front view illustrating an exemplary arrangement of reinforcing sections of the mask according to the present invention.

In the exemplary arrangement shown in FIG. 3, eight of the linear and slender through-holes 2 are provided in an aligned manner. In this arrangement, a plurality of linear reinforcing sections 3, which are arranged while being separated from each other by constant intervals or spacing distances, are provided and aligned to span the eight through-holes 2 respectively so that the reinforcing sections 3 perpendicularly intersect the direction in which the through-holes 2 extend.

Figure 4:
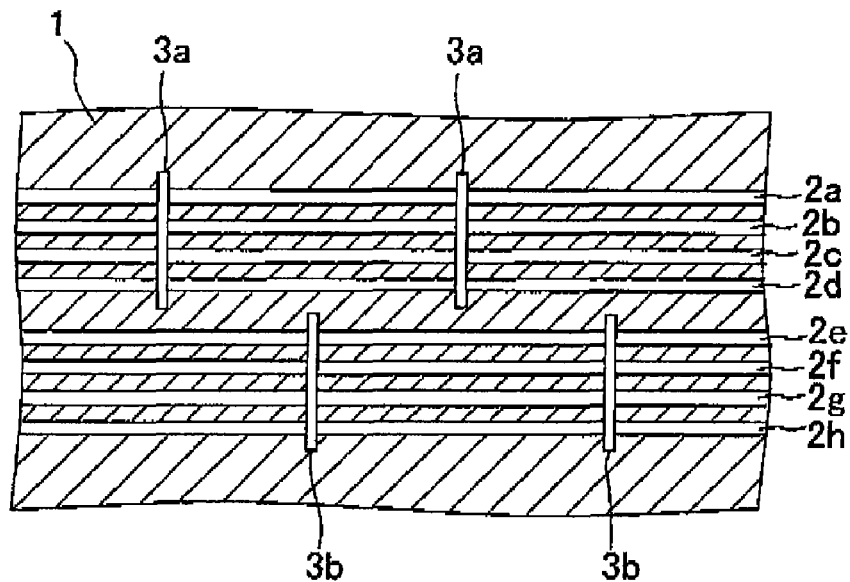
FIG. 4 shows a front view illustrating an exemplary arrangement of reinforcing sections of the mask according to the present invention.

In the exemplary arrangement shown in FIG. 4, eight of the linear and slender through-holes 2a to 2h are arranged substantially in parallel while being separated from each other by certain spacing distances, in the transverse direction perpendicular to the direction (longitudinal direction) in which the respective through-holes extend. Further, a plurality of reinforcing sections 3a are provided substantially in parallel to the transverse direction of the respective through-holes to span the four through-holes 2a to 2d respectively disposed on One side (upper side as shown in FIG. 4) in the transverse direction of the respective through-holes. Similarly, a plurality of reinforcing sections 3b are provided substantially in parallel to the transverse direction of the respective through-holes to span the four through-holes 2e to 2h respectively disposed on the other side (lower side as shown in FIG. 4) in the transverse direction of the respective through-holes. The plurality of reinforcing sections 3a, 3b are arranged alternately at the constant intervals in the longitudinal direction of the respective through-holes. In this arrangement, the portions of the reinforcing sections 3a, 3b, with which the reinforcing sections 3a, 3b span the respective through-holes, are decreased as compared with the arrangement shown in FIG. 3. Therefore, the portions, at which any breaking tends to arise when the wiring is formed, are decreased. An advantage is obtained such that the reliability of the wiring formation is improved.

Figure 5:
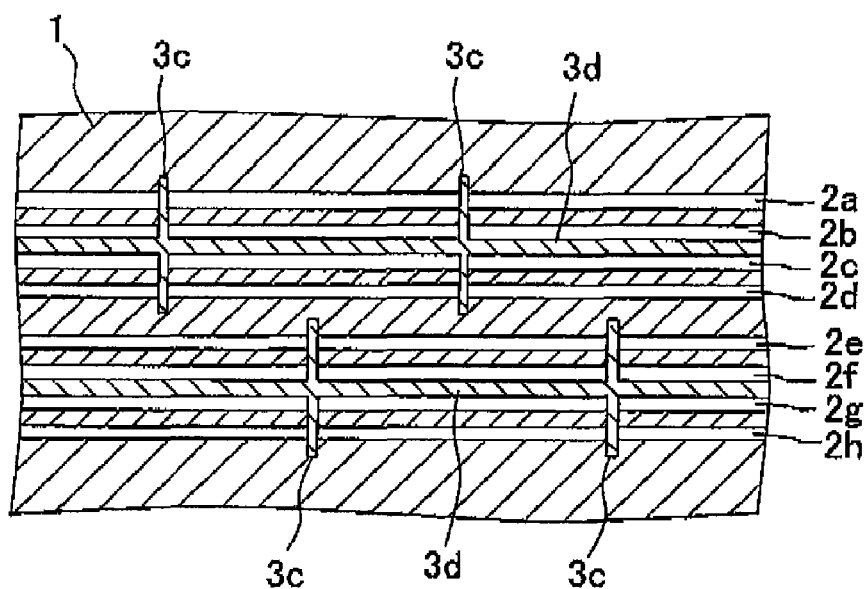
FIG. 5 shows a front view illustrating an exemplary arrangement of reinforcing sections of the mask according to the present invention.

In the exemplary arrangement shown in FIG. 5, the reinforcing strength of the reinforcing sections 3a, 3b shown in the exemplary arrangement shown in FIG. 4 is enhanced. The through-holes 2a to 2h are arranged in the same manner as in the arrangement shown in FIG. 4. The reinforcing sections shown in FIG. 5 include first reinforcing members 3c and second reinforcing members 3d. The first reinforcing members 3c are arranged to span the through-holes 2a to 2d or the through-holes 2e to 2h in the direction perpendicular to the direction in which the respective through-holes extend. The second reinforcing member 3d is a wall portion which is formed in the direction in which the respective through-holes extend, in the area 1D of the mask body 1 defined by the two through-holes 2b, 2c (or the through-holes 2f, 2g). The second reinforcing member 3d mutually connects the two first reinforcing members 3c disposed adjacently in the direction in which the respective through-holes extend. When the reinforcement is effected in the two directions as described above, the reinforcing strength of the reinforcing section is enhanced.

Figure 6:
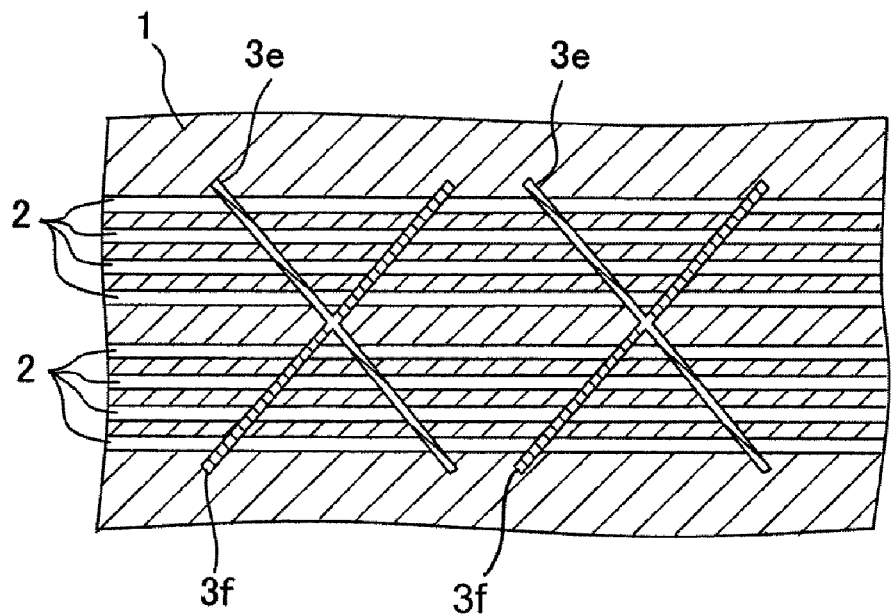
FIG. 6 shows a front view illustrating an exemplary arrangement of reinforcing sections of the mask according to the present invention.

In the exemplary arrangement shown in FIG. 6, eight of the linear through-holes 2a to 2h are provided and aligned in the same manner as in FIGS. 4 and 5. The reinforcing sections 3 include first reinforcing members 3e which span the eight through-holes 2a to 2h respectively and which extend at an angle of about 45 degrees with respect to the direction in which the respective through-holes extend, and second reinforcing members 3f which extend to span the eight through-holes 2a to 2h respectively in the same manner as described above and which are perpendicular to the first reinforcing members 3e on an identical plane. In this arrangement, the reinforcement is effected in the two directions.

Figure 7:
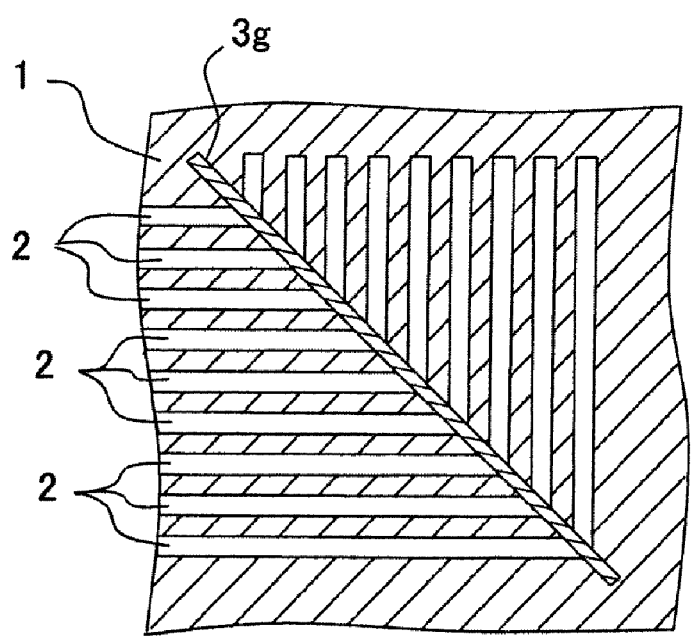
FIG. 7 shows a front view illustrating an exemplary arrangement of reinforcing sections of the mask according to the present invention.

In the exemplary arrangement shown in FIG. 7, nine of the polygonal line-shaped through-holes 2, which have bent portions, are provided and aligned. That is, the portion of each of the through-holes, which extends in the horizontal direction, intersect the portion which extends in the vertical direction, at the bent portion. The bent portions of the respective through-holes are aligned in one array in the direction to form an angle of about 45 degrees with respect to the horizontal direction. The reinforcing section 3g is provided to span the bent portions of the respective through-holes in this direction respectively. Accordingly, the bent portions of the wiring pattern, at which the strain arises most possibly, can be reliably reinforced.

Figure 8:
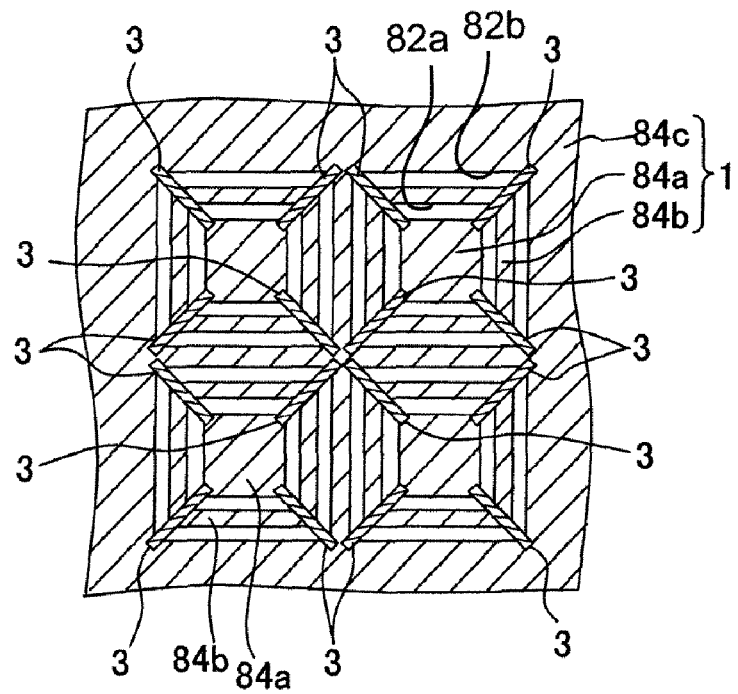
FIG. 8 shows a front view illustrating an exemplary arrangement of reinforcing sections of the mask according to the present invention.
Figure 9:
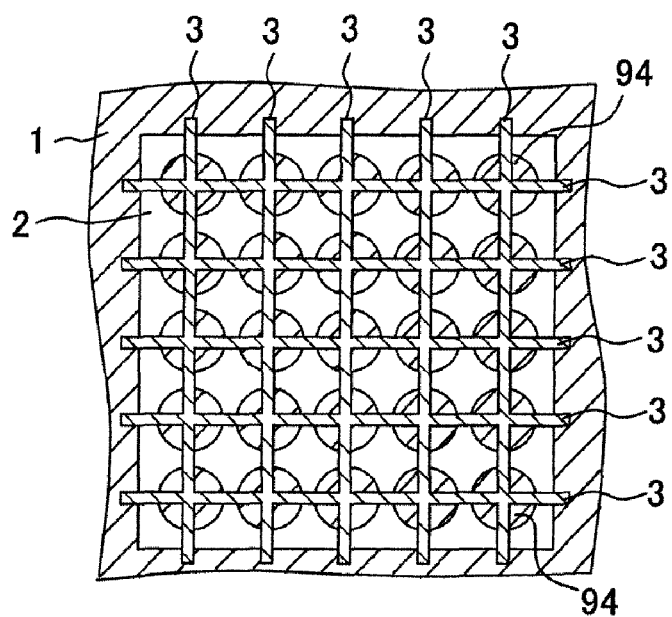
FIG. 9 shows a front view illustrating an exemplary arrangement of reinforcing sections of the mask according to the present invention.

FIGS. 8 and 9 show the exemplary arrangements of the reinforcing sections 3 when island-portions are provided in the through-holes 2. The island-portion is herein such a portion that all of the surroundings are defined by the through-holes when the reinforcing section is removed. FIG. 8 shows an example of the mask in order that two rectangular wirings, which have different sizes, are formed concentrically. With reference to FIG. 8, the mask body 1 is provided with a substantially rectangular first island-portion 84a, a second island-portion 84b, a mask outer circumferential portion 84c, and the reinforcing section 3. The second island-portion 84b is defined by a through-hole 82a which is formed to have a constant width around the first island-portion 84a and which has a substantially rectangular frame-shaped form as viewed in a plan view, and a through-hole 82b which is concentric with the through-hole 82a and which is formed to have a substantially rectangular frame-shaped form slightly larger than the above. The mask outer circumferential portion 84c is arranged outside the second island-portion 84b with the through-hole 82b intervening therebetween. The reinforcing sections 3 are arranged one by one at the four corners in the diagonal line directions of the first island-portion 84a and the second island-portion 84b. Each of the reinforcing sections 3 connects and fixes the corner of the first island-portion 84a, the corner of the second island-portion 84b, and the mask outer circumferential portion 84c. The reinforcing sections 3 are arranged to span the through-holes 84a, 84b respectively. The wiring pattern can be formed as described above by using the mask having the island-portions which cannot be realized with any mask having no reinforcing section 3.

In the case of the mask shown in FIG. 9, twenty-five of circular island-portions 94b are provided and aligned in the large rectangular through-hole 2 formed at a mask outer circumferential portion 94a. The island-portions 94b are arranged in a matrix form of five rows and five columns. The row direction and the column direction of the matrix are parallel to the horizontal direction and the vertical direction of the rectangle which is the outer circumferential shape of the through-hole 2 respectively. The island-portions 94b are connected by the linear reinforcing sections 3 at the respective rows and the respective columns, and they are fixed to the mask outer circumferential portion 94a.

Figure 10:
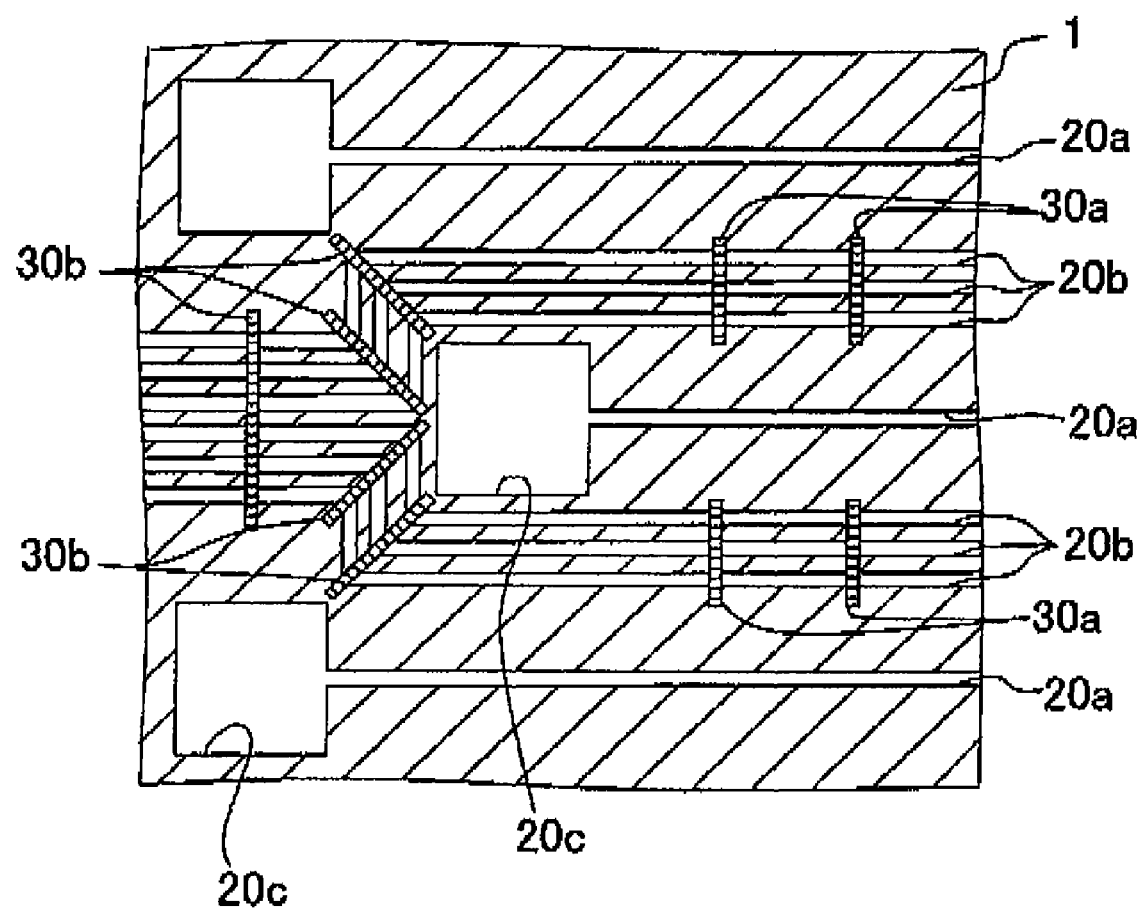
FIG. 10 shows a front view illustrating an exemplary arrangement of reinforcing sections of the mask according to the present invention.

FIG. 10 shows the exemplary arrangement of the mask for forming a wiring pattern having a shape approximate to the actual wiring. The exemplary mask arrangements shown in FIGS. 3 and 7 are combined with each other. Those formed on the mask body 1 include three of through-holes 20c each of which has a substantially rectangular shape as viewed in a plan view, and slender through-holes 20a each of which extends linearly toward the outside of the through-hole from a substantially central position of one side of each of the through-holes 20c. In this arrangement, the three through-holes 20a are formed substantially in parallel. The three through-holes 20c are formed while providing certain spacing distances in the transverse direction which is perpendicular to the longitudinal direction in which the through-holes 20a extend. As for the longitudinal direction, the central through-hole 20c is arranged in a deviated manner in the direction in which the through-holes 20a extend, as compared with the two through-holes 20c disposed at the both ends. Six of slender through-holes 20*b*, which extend in the longitudinal direction of the through-holes 20*a*, are formed between the through-holes 20*c* disposed at the both ends. In order to avoid the intersection with the central through-hole 20*c*, every three of the through-holes 20*b*, which are disposed on the both sides in the transverse direction of the through-holes 20*a*, are formed and bent toward the both sides in the transverse direction of the through-holes 20*a* respectively, and they are formed and bent in the longitudinal direction of the through-holes 20*a* outside the central through-hole 20*c*. In other words, the six slender through-holes 20*b* are divided into the two groups composed of the three through-holes 20*b* which extend in the longitudinal direction of the through-holes 20*a* while avoiding the central through-hole 20*c*. The reinforcing sections 30*a*, which are perpendicular to the extending direction of the through-holes 20*b*, are arranged to span the plurality of through-holes 20*b* respectively in the same manner as the exemplary arrangement shown in FIG. 3, at the portions at which the plurality of slender through-holes 20*b* extending in parallel are formed. The reinforcing sections 30*b*, which span the bent portions respectively in the same manner as in the exemplary arrangement shown in FIG. 7, are arranged at the portions at which the bent portions of the plurality of through-holes 20*b* are provided and aligned.

Next, an explanation will be made about a method for producing the mask as described above. FIG. 11 schematically shows the steps of forming the mask areas in the mask production method according to the present invention. FIG. 11 shows the states of the mask in the production steps in a chronological order from the top to the bottom. In FIG. 11, sectional views of the mask are shown on the left side, and plan views corresponding to the sectional views are shown on the right side.

Figure 11A:
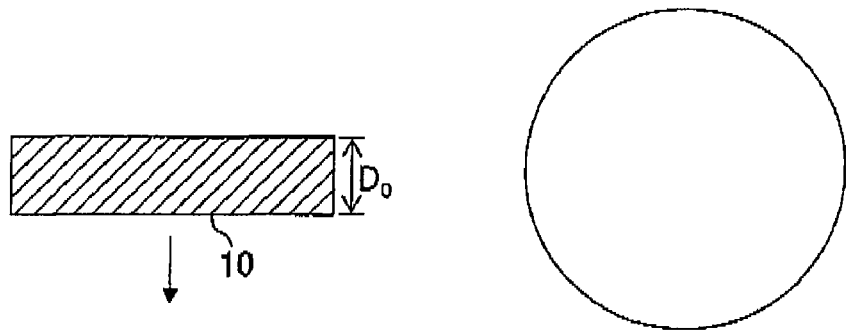
FIGS. 11A to 11D schematically show steps of forming the mask areas in accordance with the method for producing the mask according to the present invention.

FIG. 11A shows a wafer 10 before being processed. In this embodiment, the mask according to the present invention is produced from the disk-shaped wafer 10 made of silicon of 4 inches. The thickness $D_0$ of the wafer 10 is about 500 μm. The mask of the present invention is formed such that forty-four areas (mask areas) each having a substantially square shape, each of which has one side of about 10 mm and a thickness of about 50 μm, are formed on the wafer 10, and a plurality of through-holes are bored through each of the areas. The method for producing the mask will be described in detail below.

Figure 11B:
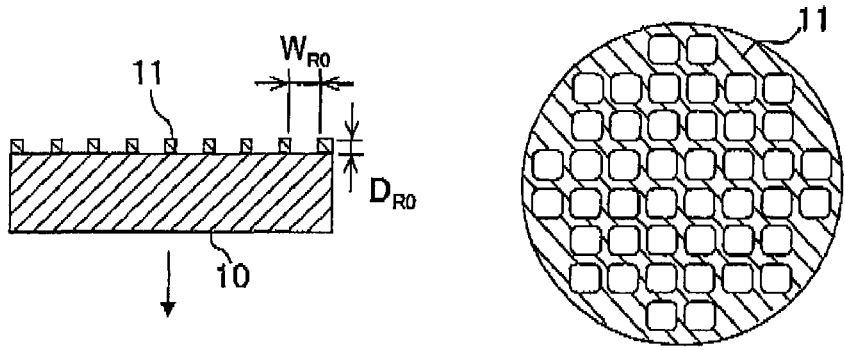

At first, the entire surface of the wafer 10 is coated with the resist. Subsequently, the resist is exposed via a mask for the exposure having openings corresponding to the forty-four mask areas. After that, the exposed portions of the resist are removed by means of the development. Accordingly, a resist mask 11 is formed, which has the forty-four openings each having a substantially square shape and each having a length $W_{R0}$ of one side of about 10 mm. FIG. 11B shows a state obtained after the formation of the resist mask 11. Specifically, the resist mask 11 is formed such that resist SU-8 produced by Kayaku MicroChem is applied to the entire surface of the wafer 10 by using a spin coater TH-DX2 produced by Mikasa to perform the exposure by using an exposure apparatus SE-571 produced by Ushio, followed by being developed with a developing solution based on 2-propyl acetate. Typically, the formed resist mask 11 has a thickness $D_{R0}$ of about 40 μm.

Figure 11C:
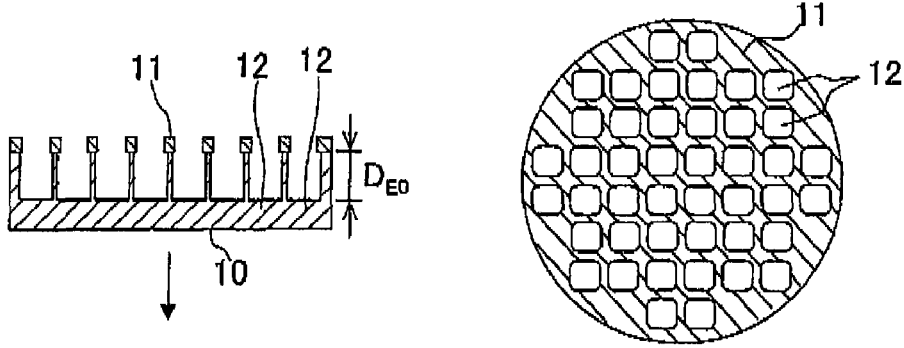

Subsequently, the etching is performed on the wafer 10 coated with the resist mask 11. The etching is the anisotropic etching. The etching is performed, for example, by using an etching apparatus MULTIPLEX-ASE-HRM produced by STS and alternately performing the processing with $SF_6$ gas and $C_4F_8$ gas in accordance with the Bosch process. FIG. 11C shows a state obtained after the etching. The etching condition in this process is as follows. That is, the velocity is 5 μm/min, the selection ratio is 50:1, and the aspect ratio is 30:1. The etching depth $D_{E0}$ is about 450 μm.

Figure 11D:
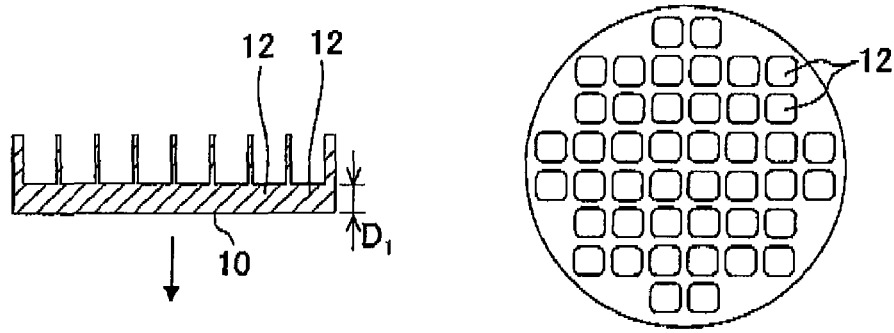

Subsequently, the resist mask 11, which has been formed on the surface of the wafer 10, is exfoliated. The resist mask is exfoliated by using, for example, an exfoliating solution based on alkylbenzene. FIG. 11D shows a state obtained after the exfoliation of the resist mask 11. When the resist mask 11 is subjected to the exfoliation, then the mask areas-forming steps are completed, and the forty-four mask areas 12 are formed on the wafer 10. Each of the mask areas 12 has a square shape having a length of one side of about 10 mm, which has a flat plate-shaped form having a thickness $D_1$ of about 50 μm.

FIGS. 12 and 13 schematically show the steps of forming the through-holes 2, the reinforcing sections 3, and the recesses 4 in relation to the method for producing the mask according to the present invention. FIGS. 12 and 13 show the states of the mask in the production steps in a chronological order from the top to the bottom. In FIGS. 12 and 13, sectional views of the mask are shown on the left side, and plan views corresponding to the sectional views are shown on the right side. FIGS. 12 and 13 show magnified one of the mask areas 12 shown in FIG. 11. The linear and slender through-holes 2 which are arranged in parallel, and the reinforcing sections 3 which span all of the through-holes 2 and which are disposed perpendicularly to the direction in which the through-holes 2 extend are formed in the mask area 12. This arrangement corresponds to the exemplary arrangement of the through-holes 2 and the reinforcing sections 3 shown in FIG. 3.

Figure 12A:
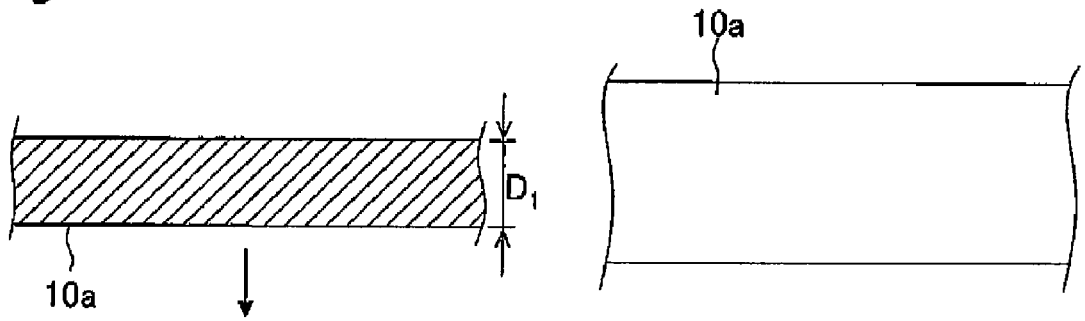
FIGS. 12A to 12D schematically show steps of forming the through-holes, the reinforcing sections, and the recesses in accordance with the method for producing the mask according to the present invention.

FIG. 12A shows a magnified portion of the mask area 12 formed in the mask area-forming steps explained with reference to FIGS. 11A to 11D. The flat plate-shaped mask base material 10*a* has a thickness $D_1$ of about 50 μm.

Figure 12B:
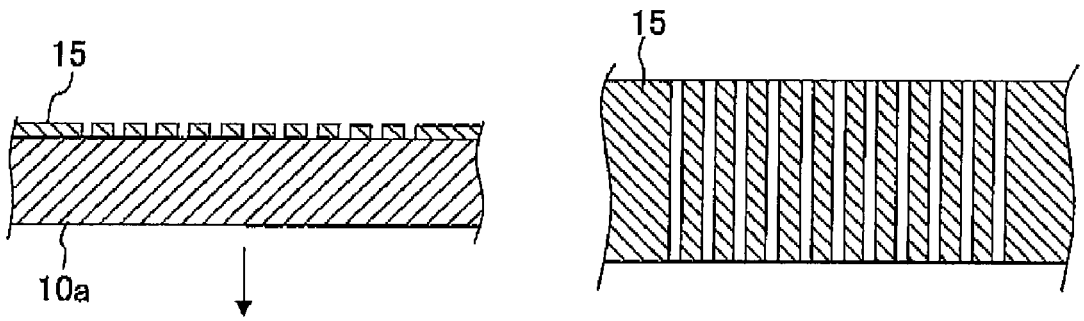

At first, the first guide pattern-forming step is performed. In the first guide pattern-forming step, a resist pattern (first guide pattern) 15, which has openings to form the through-holes 2 and the recesses 4 by means of the etching, is formed on the surface of the flat plate-shaped mask base material 10*a*. FIG. 12B shows a state obtained after the formation of the resist pattern 15. The resist pattern 15 is applied by using the same apparatuses as those used in the step shown in FIG. 11B.

Figure 12C:
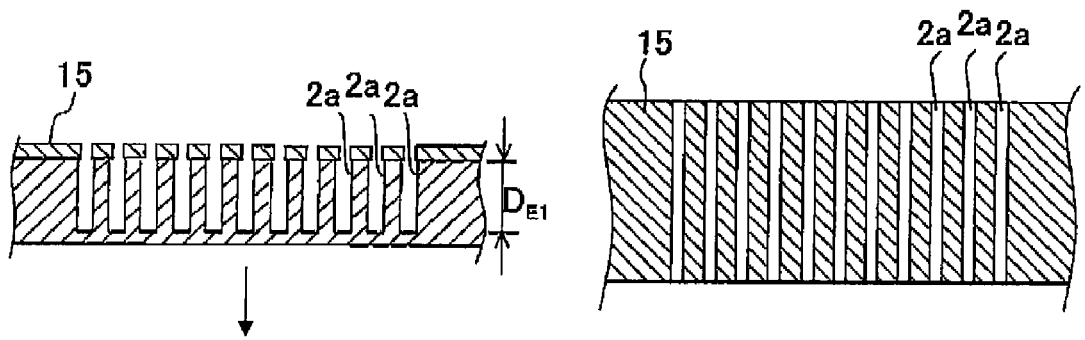

Subsequently, a first etching step is performed. In the first etching step, the anisotropic etching is performed on one surface (surface) of the mask base material 10*a* to form grooves 2*a* in accordance with the resist pattern 15 formed in the first guide pattern-forming step. The grooves 2*a* are thereafter converted into the through-holes 2 and the recesses 4. FIG. 12C shows a state obtained after the etching. The depth $D_{E1}$ of the etching is about 40 μm. Therefore, no penetration is caused through the mask base material 10*a*. The etching is performed by using the same apparatuses as those used in the step shown in FIG. 11C.

Figure 12D:
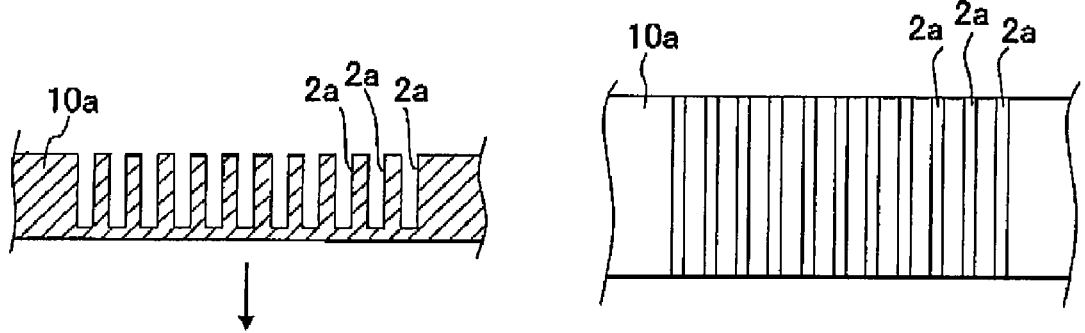

Subsequently, a first exfoliating step is performed. In the first exfoliating step, the resist pattern 15, which is formed on the surface of the mask base material 10*a* in the first guide pattern-forming step, is exfoliated. FIG. 12D shows a state obtained after the exfoliation of the resist pattern 15. The resist pattern 15 is exfoliated in accordance with the same method as that in the step shown in FIG. 11D.

Figure 13A:
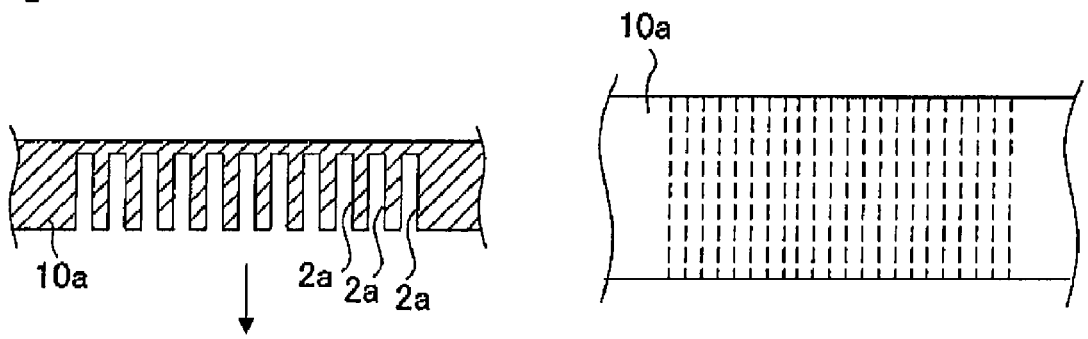
FIGS. 13A to 13D schematically show steps of forming the through-holes, the reinforcing sections, and the recesses in accordance with the method for producing the mask according to the present invention.

Subsequently, the mask base material 10*a* after the exfoliation of the resist pattern 15 is reversed. FIG. 13A shows a state in which the mask base material 10*a* is reversed. The reason, why the mask base material 10*a* is reversed, is that it is intended to perform the etching on the opposite surface (back surface) of the mask base material 10a in order to form the reinforcing section 3.

Figure 13B:
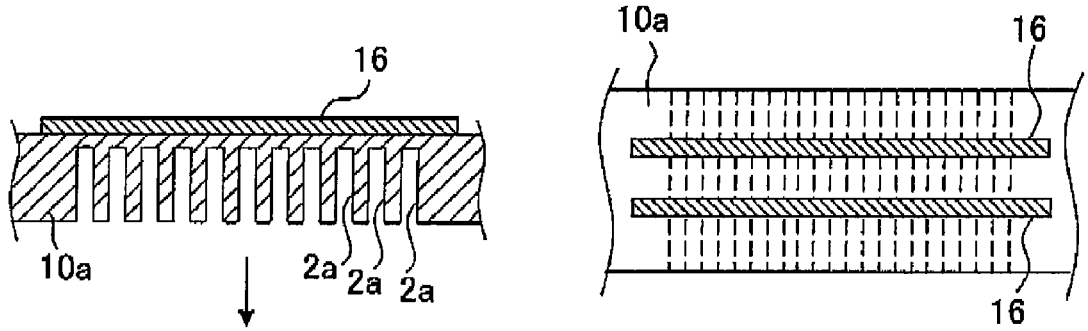

Subsequently, a second guide pattern-forming step is performed. In the second guide pattern-forming step, a resist pattern (second guide pattern) 16, which is the pattern to form the reinforcing sections 3 by means of the etching, is formed on the surface of the reversed mask base material 10a. FIG. 13B shows a state obtained after the formation of the resist pattern 16. The resist pattern 16 is formed by using the same apparatuses as those used in the step shown in FIG. 11B.

Figure 13C:
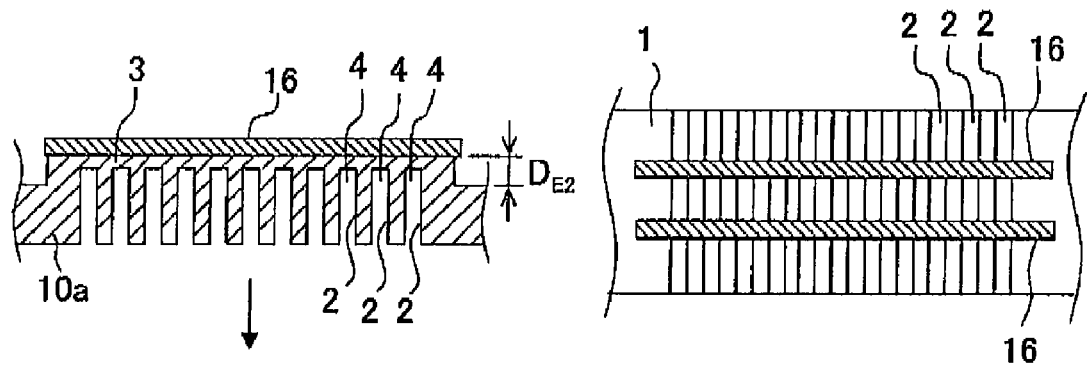

Subsequently, a second etching step is performed. The anisotropic etching is performed on the mask base material 10a to form the reinforcing sections 3 in accordance with the resist pattern 16 formed in the second guide pattern-forming step. FIG. 13C shows a state obtained after the reinforcing sections 3 are formed by means of the etching. The depth $D_{E2}$ of the etching performed in this process is about 25 μm. The relationship among the depth $D_{E2}$ performed in the second etching step, the depth $D_{E1}$ of the etching performed in the first etching step, and the thickness $D_1$ of the mask base material 10a shown in FIG. 12A is represented by the following expression.

$$D_{E1}+D_{E2}>D_1 \quad (1)$$

Therefore, the grooves, which are formed in the first etching step, are converted into the through-holes by being subjected to the etching from the back surface of the mask base material 10a in accordance with the second etching step. The etching is performed by using the same apparatuses as those used in the step shown in FIG. 11C.

Figure 13D:
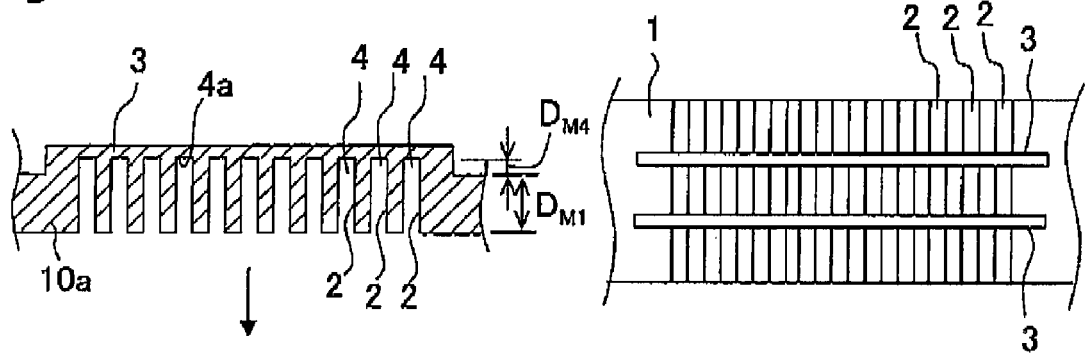

Subsequently, a second exfoliating step is performed. In the second exfoliating step, the resist pattern 16, which is formed in the second guide pattern-forming step, is exfoliated. FIG. 13D shows a state obtained after the exfoliation of the resist pattern 16. The resist pattern 16 is exfoliated in accordance with the same method as that in the step shown in FIG. 11D.

In accordance with the production steps as described above, it is possible to produce the mask which has the reinforcing sections 3 and the recesses 4 and which is formed with the through-holes 2. The thickness $D_{M1}$ of the mask body 1 is determined by the thickness $D_1$ of the mask base material 10a and the depth $D_{E2}$ of the etching in the second etching step. The relationship represented by the following expression (2) holds between them. The depth $D_{M4}$ of the recess 4 is determined by the thickness $D_1$ of the mask base material 10a, the depth $D_{E1}$ of the etching in the first etching step, and the depth $D_{E2}$ of the etching in the second etching step. The relationship represented by the following expression (3) holds between them. In this embodiment, the thickness $D_{M1}$ of the mask body 1 is about 25 μm, and the depth $D_{M4}$ of the recess 4 is about 15 μm. The distance between the lower surface of the mask body 1 and the portion of the reinforcing section 3 to cover the through-hole 2 is equal to the depth $D_{E1}$ of the etching in the first etching step.

$$D_{M1}=D_1-D_{E2} \quad (2)$$

$$D_{M4}=(D_{E1}+D_{E2})-D_1 \quad (3)$$

When the mask base material 10a is subjected to the etching from the both surfaces, it is possible to produce the mask having the recesses 4 at the portions of the reinforcing sections 3 to cover the through-holes 2. The depth $D_{M1}$ of the mask body 1 can be determined by the etching depth in the second etching step, and the distance between the reinforcing section 3 and the lower surface of the mask body 1 can be determined by the etching depth in the first etching step. Accordingly, the mask can be formed so that the thickness of the mask body 1 is thin and the distance between the reinforcing section 3 and the lower surface of the mask body 1 is increased farther, within the allowable range of the mask strength.

FIG. 14 schematically shows the steps of producing the wirings on the board by using the mask according to the present invention. FIG. 14 shows the states of the mask and the board in the production steps in a chronological order from FIG. 14A to FIG. 14E.

Figure 14A:
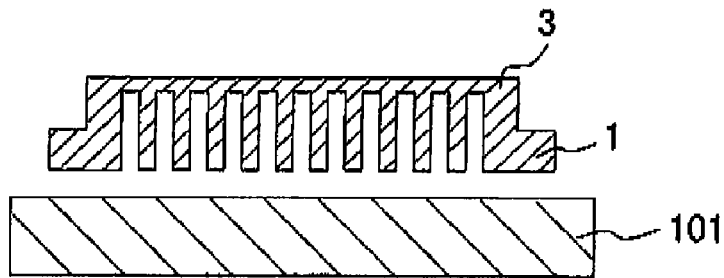
FIGS. 14A to 14E schematically shows production steps of forming wirings on a board by using the mask according to the present invention.

At first, the mask is positioned with respect to the board 101. FIG. 14A shows a state obtained after performing the positioning of the mask. The mask is arranged while making tight contact with the board 101 or providing a certain spacing distance with respect to the board 101 so that the surface of the mask body 1, which is disposed on the side of no provision of the reinforcing section 3, is opposed to the substrate 101.

Figure 14B:
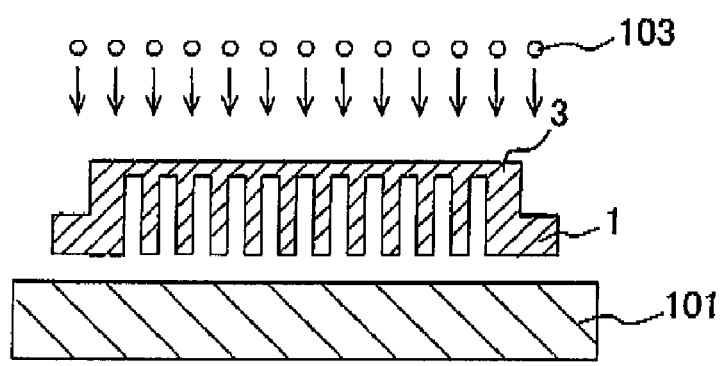
Figure 14C:
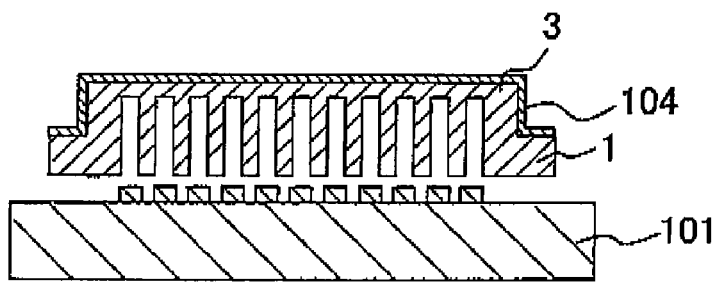

Subsequently, in order to form the wirings on the board 101, the metal particles 103 composed of, for example, platinum or gold are allowed to fly from the side of the surface (upper surface) on which the reinforcing sections 3 of the mask are not provided, for example, by means of the sputtering method so that the metal particles 103 are deposited on the board 101. FIG. 14B shows a situation in which the metal particles 103 are deposited, and FIG. 14C shows a state in which the deposition of the metal particles 103 is completed. When the metal particles 103 are deposited, then the metal particles 103, which are deposited on the board 101, form the metal wirings, and the formation of the wired board is completed. In this situation, the metal particles 103 are adhered to the upper surfaces of the mask body 1 and the reinforcing sections 3 to form the metal film 104.

Figure 14D:
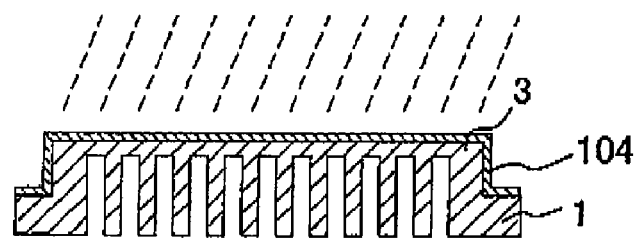
Figure 14E:
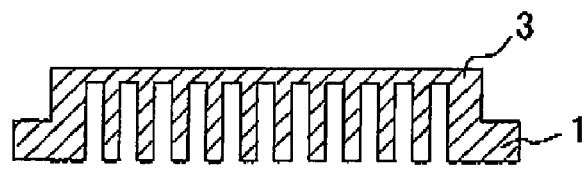

Subsequently, the step of removing the metal particles 14 is performed. In the removing step, a strong acid solution such as aqua regia or nitric acid is used to dissolve and exfoliate the metal film 104. FIG. 14D shows a situation of the removal of the metal film 104, and FIG. 14E shows a state of the mask obtained after the metal film 104 is removed. It is possible to reuse the mask by removing the metal film 104.

In this embodiment, several types of examples of the mask are described in order to form the wiring pattern having the linear form or the polygonal line-shaped form. However, there is no limitation thereto. Other shapes or forms are also available, including, for example, wiring patterns in which a plurality of curved wirings are provided and aligned. In the steps of producing the mask, the mask base material 10a is reversed before the second guide pattern-forming step. However, it is not necessarily indispensable that the mask base material 10a is reversed. For example, the dimensions and the processing dimensions of the mask are described by way of example in this embodiment, and there is no limitation thereto. The types of, for example, the apparatuses for the production, the resist, and the exfoliating agent to be used in the respective steps are described by way of example in the steps of producing the mask of this embodiment, and there is no limitation thereto. The etching condition to be performed in the steps of producing the mask is described by way of example in this embodiment, and there is no limitation thereto. Further, the deposition method (the film forming method) by using metal particles 103 is not limited to the sputtering method described above, and it is possible to use general film forming methods such as a vapor evapolation method or the like. However the sputtering method is used in the above embodiment because of the strong adhesion of the film and the facility for controling the thickness of the film.

Second Embodiment

Figure 15:
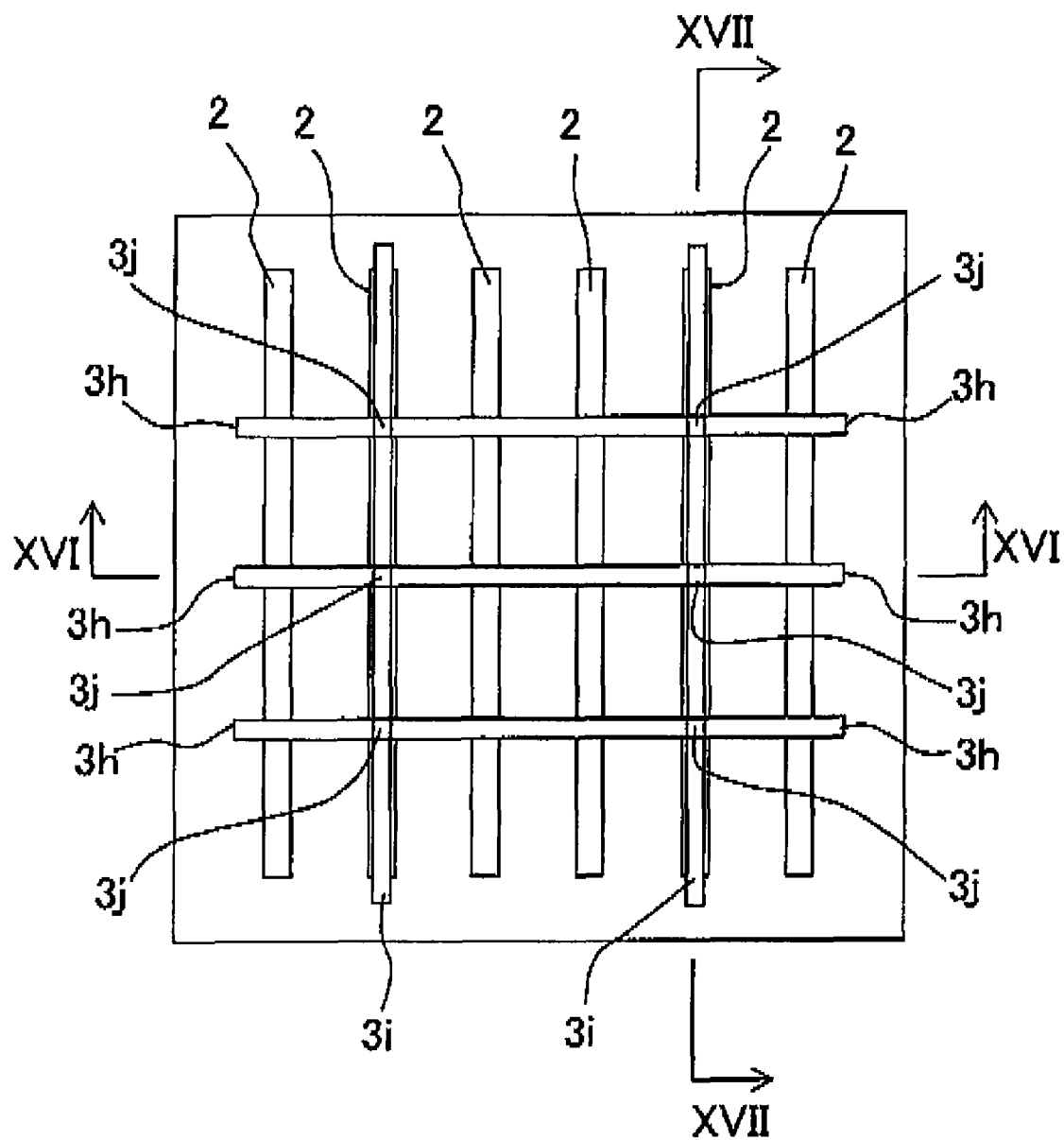
FIG. 15 shows a plan view illustrating a mask according to a second embodiment of the present invention.
Figure 16:
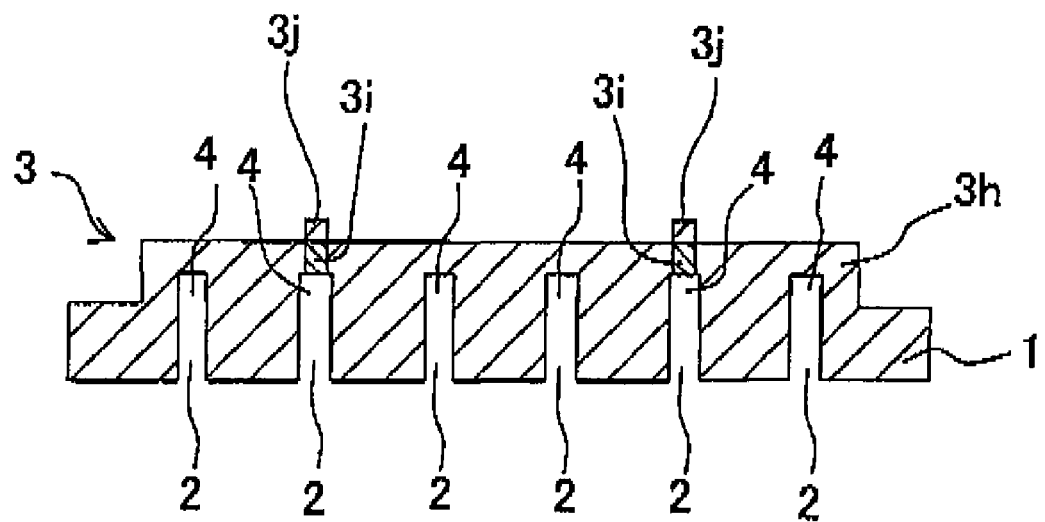
FIG. 16 shows a sectional view taken along a line XVI-XVI shown in FIG. 15.
Figure 17:
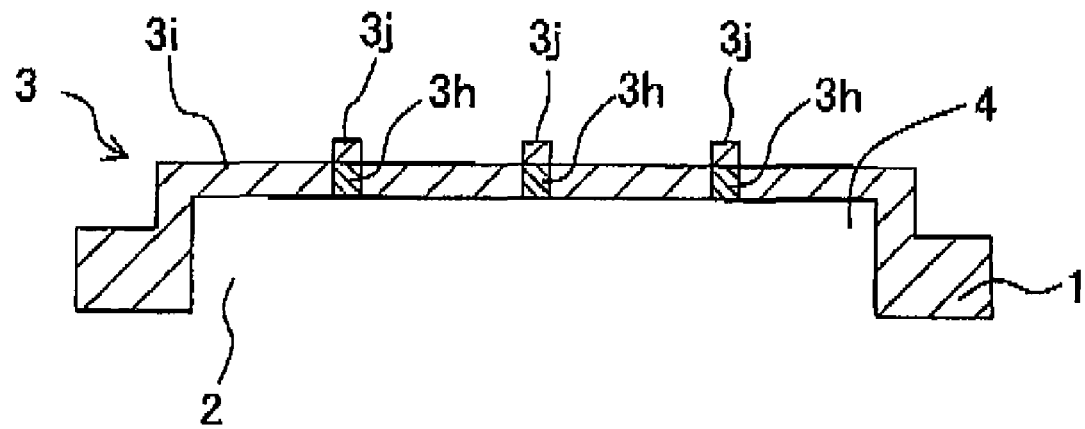
FIG. 17 shows a sectional view taken along a line XVXI-XVII shown in FIG. 15.

FIG. 15 shows a plan view illustrating a mask according to a second embodiment. FIG. 16 shows a sectional view taken along a line XVI-XVI shown in FIG. 15. FIG. 17 shows a sectional view taken along a line XVII-XVII shown in FIG. 15. In the mask according to this embodiment, the strength of the intersecting portion between the first reinforcing member and the second reinforcing member is enhanced when the reinforcing section includes the first reinforcing member and the second reinforcing member which make the intersection with each other, in the same manner as in the mask according to the first embodiment shown in FIGS. 5 and 6.

The constitutive components of the mask according to the second embodiment, which are the same as or equivalent to the constitutive components of the mask according to the first embodiment, are designated by the same reference numerals, any detailed explanation of which will be omitted. The steps of the method for producing the mask according to this embodiment, which are the same as or equivalent to the steps of the method for producing the mask according to the first embodiment, are designated by the same names of the steps, any detailed explanation of which will be omitted.

As shown in FIG. 15, a mask body 1 is formed with a plurality of linear and slender through-holes 2 which extend in parallel. The reinforcing sections 3 include first reinforcing members 3h and second reinforcing members 3i which have slender shapes respectively. The first reinforcing members 3h are arranged so that the first reinforcing members 3h are substantially perpendicular to the direction in which the through-holes 2 extend. The second reinforcing members 3i are arranged so that the second reinforcing members 3i are substantially perpendicular to the longitudinal direction of the first reinforcing members 3h and the second reinforcing members 3i cover the openings of the through-holes 2 in the direction in which the through-holes 2 extend. However, the width of the second reinforcing member 3i in the transverse direction is slenderer than the width of the through-hole 2 in the transverse direction. Therefore, the entire opening of the through-hole 2 is not covered with the second reinforcing member 3i.

The second reinforcing member 3i is arranged in the longitudinal direction of the through-hole 2 in the area in which the second reinforcing member 3i is substantially overlapped with the through-hole 2 as viewed in a plan view. The second reinforcing member 3i is supported by only the both end portions and the intersecting portions with respect to the first reinforcing members 3h. Therefore, in order to enhance the stability of the second reinforcing member 3i, third reinforcing members 3j are provided on the upper sides (side opposite to the through-hole 2) of the intersecting portions between the first reinforcing members 3h and the second reinforcing member 3i. The third reinforcing member 3j is provided in such a form that the intersecting portion is allowed to protrude upwardly by increasing the thickness of the intersecting portion between the first reinforcing member 3h and the second reinforcing member 3i. Accordingly, the stability of the second reinforcing member 3i is enhanced.

FIGS. 18, 19, and 20 schematically show steps of producing the mask according to this embodiment. FIG. 18 shows the steps of forming the through-holes and the recesses of the reinforcing sections, FIG. 19 shows the steps of forming the first reinforcing members, and FIG. 20 shows the steps of forming the second reinforcing members and the third reinforcing members. The steps of forming the mask areas are omitted from the steps referred to in this embodiment.

Figure 18A:
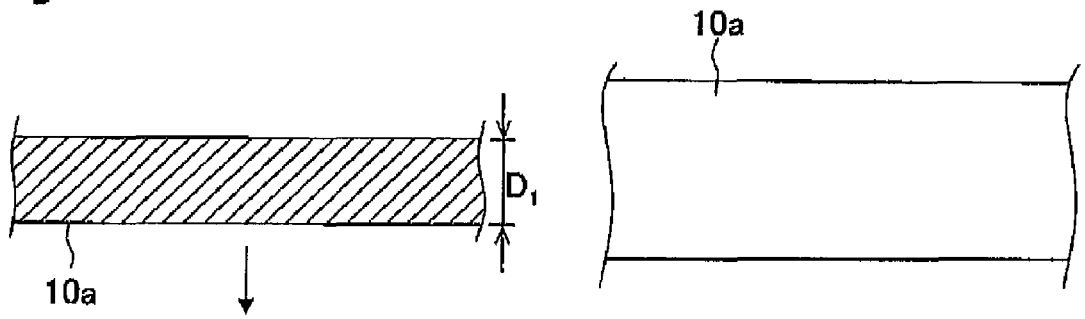
FIGS. 18A to 18D schematically show steps of producing the mask according to the second embodiment of the present invention.

FIG. 18A shows a magnified portion of the mask area formed in the mask area-forming steps. The thickness $D_1$ indicates the thickness of the flat plate-shaped mask base material 10a. In this embodiment, the thickness $D_1$ is about 55 μm.

Figure 18B:
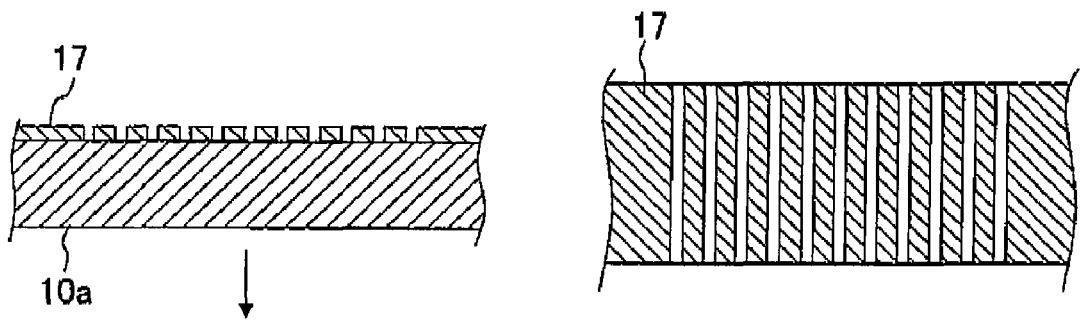

At first, the first guide pattern-forming step is performed. In the first guide pattern-forming step, a resist pattern 17 is formed on the surface of the flat plate-shaped mask base material 10a. FIG. 18B shows a state obtained after the formation of the resist pattern 17. In this embodiment, the resist pattern 17 has the openings to form the through-holes 2 and the recesses 4 by means of the etching.

Figure 18C:
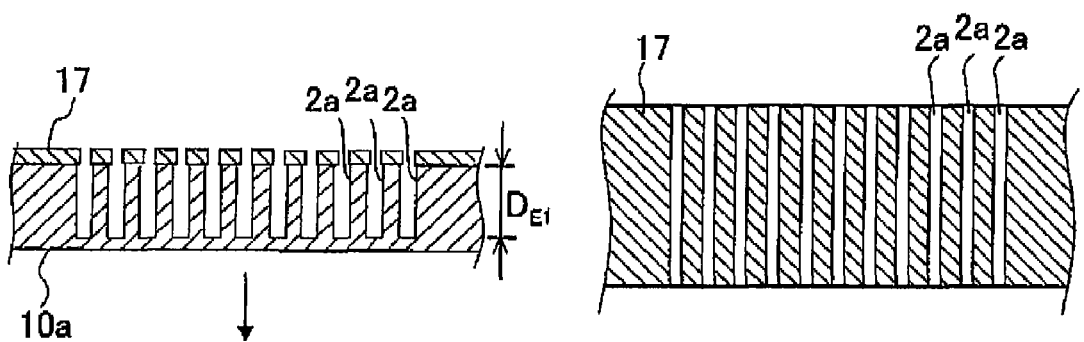

Subsequently, a first etching step is performed. In the first etching step, the anisotropic etching is performed on the mask base material 10a to form grooves 2a which are to be converted into the through-holes 2 and the recesses 4, in accordance with the resist pattern 17 formed in the first guide pattern-forming step. FIG. 18C shows a state obtained after the etching. The depth $D_{E1}$ of the etching performed in this process is about 40 μm. No penetration is caused through the mask base material 10a.

Figure 18D:
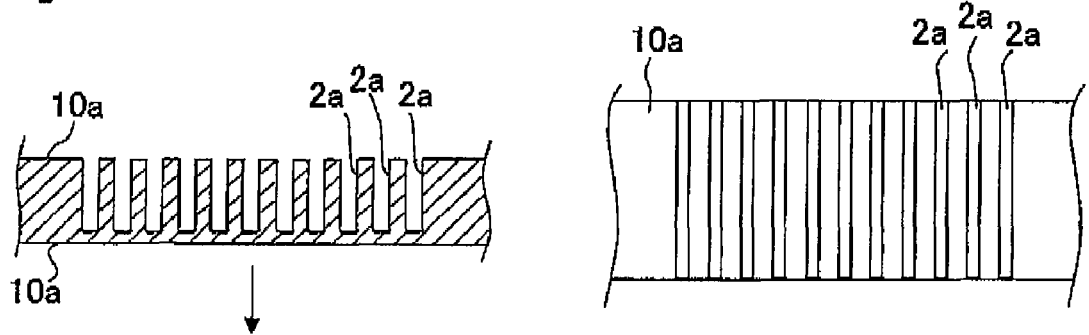

Subsequently, a first exfoliating step is performed. In the first exfoliating step, the resist pattern 17, which is formed on the surface of the mask base material 10a in the first guide pattern-forming step, is exfoliated. FIG. 18D shows a state obtained after the exfoliation of the resist pattern 17.

Figure 19A:
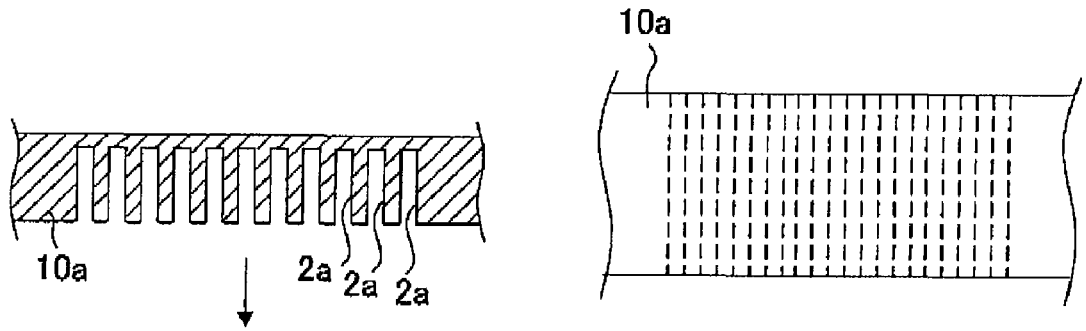
FIGS. 19A to 19D schematically show steps of producing the mask according to the second embodiment of the present invention.

Subsequently, the mask base material 10a after the exfoliation of the resist pattern 17 is reversed. FIG. 19A shows a state in which the mask base material 10a is reversed. The reason, why the mask base material 10a is reversed, is that it is intended to perform the etching on the opposite surface of the mask base material 10a in order to form the reinforcing section 3.

Figure 19B:
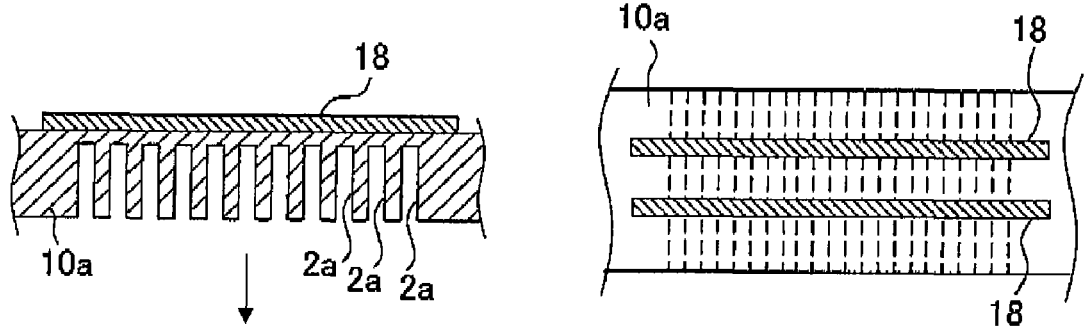

Subsequently, a second guide pattern-forming step is performed. In the second guide pattern-forming step, a resist pattern 18 is formed on the surface of the reversed mask base material 10a. In this embodiment, the resist pattern 18 is the pattern to form the first reinforcing members 3h of the reinforcing sections 3 by means of the etching. FIG. 19B shows a state obtained after the formation of the resist pattern 18.

Figure 19C:
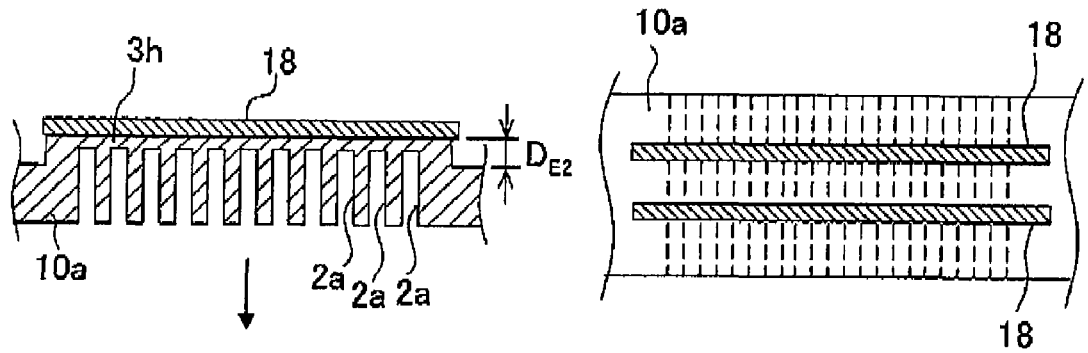

Subsequently, a second etching step is performed. The anisotropic etching is performed on the mask base material 10a to form the first reinforcing members 3h in accordance with the resist pattern 18 formed in the second guide pattern-forming step. FIG. 19C shows a state obtained after the first reinforcing members 3h are formed by means of the etching. The depth $D_{E2}$ of the etching performed in this process is about 10 μm. At this stage, the grooves 2a do not penetrate through the mask base material 10a.

Figure 19D:
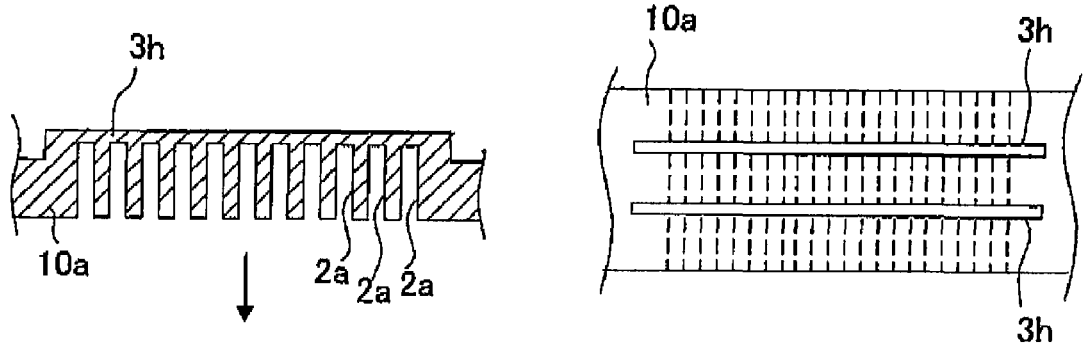

Subsequently, a second exfoliating step is performed. In the second exfoliating step, the resist pattern 18, which is formed in the second guide pattern-forming step, is exfoliated. FIG. 19D shows a state obtained after the exfoliation of the resist pattern 18.

Figure 20A:
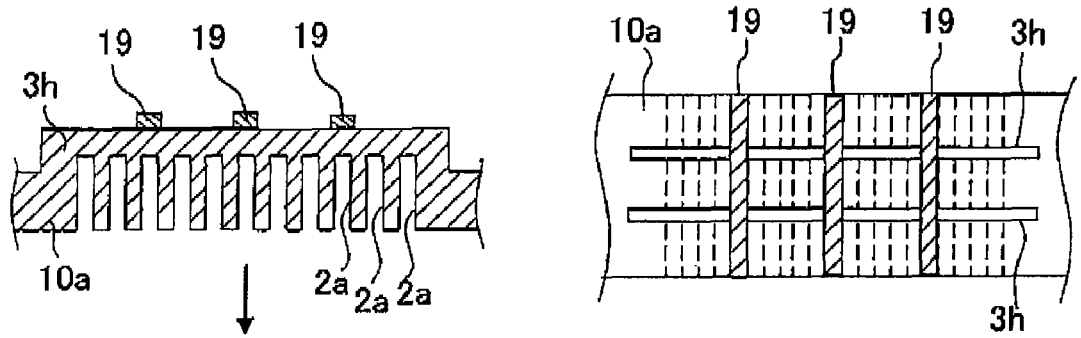
FIGS. 20A to 20C schematically show steps of producing the mask according to the second embodiment of the present invention.

Subsequently, a third guide pattern-forming step is performed. In the third guide pattern-forming step, a resist pattern 19 is formed. In this embodiment, the resist pattern 19 is the pattern to form the second reinforcing members 3i and the third reinforcing members 3j of the reinforcing sections 3. FIG. 20A shows a state obtained after the formation of the resist pattern 19. The resist pattern 19 is applied to ride over the first reinforcing members 3h having been already formed. However, when the application is performed so that the resist pattern 19 has a sufficient thickness, it is possible to exclude, for example, the fear of interruption of the guide pattern. The resist pattern 19, which is formed on the first reinforcing members 3h, serves as the pattern to form the third reinforcing members 3j.

Figure 20B:
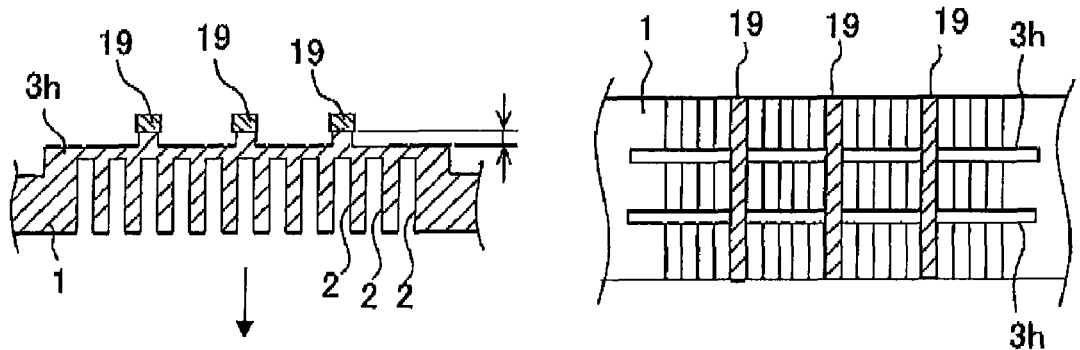

Subsequently, a third etching step is performed. In the third etching step, the anisotropic etching is performed on the mask base material 10a to form the second reinforcing members 3i and the third reinforcing members 3j of the reinforcing sections 3 in accordance with the resist pattern 19 formed in the third guide pattern-forming step. FIG. 20B shows a state obtained after the etching is performed. The depth $D_{E3}$ of the etching performed in this process is about 10 µm. The relationship among the depth $D_{E2}$ of the etching performed in the second etching step, the depth $D_{E1}$ of the etching performed in the first etching step, and the thickness $D_1$ of the mask base material 10a is represented by the following expression. Therefore, the grooves 2a, which are formed in the first etching step, are subjected to the penetration as a result of the third etching steps and the grooves 2a are converted into the through-holes 2 to form the wiring pattern.

$$D_{E1}+D_{E2}+D_{E3}>D_1 \quad (4)$$

Figure 20C:
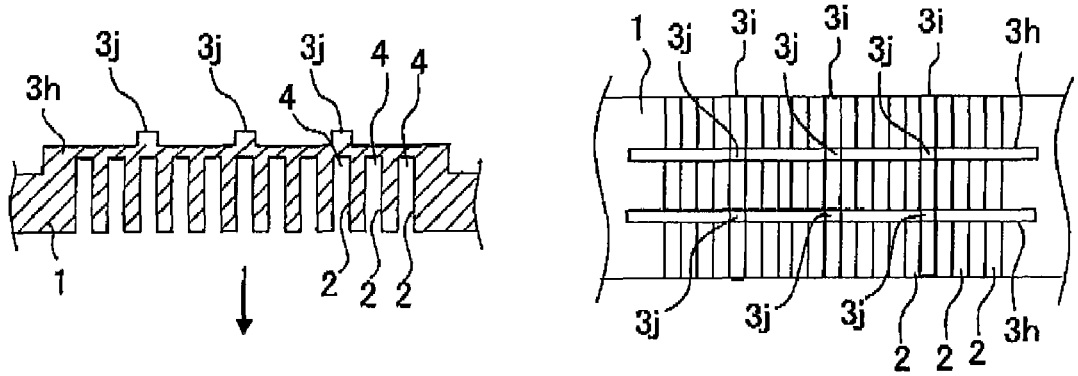

Subsequently, a third exfoliating step is performed. In the third exfoliating step, the resist pattern 19, which is formed in the third guide pattern-forming step, is exfoliated. FIG. 20C shows a state obtained after performing the exfoliation of the resist pattern 19.

In accordance with the production steps as described above, it is possible to form the third reinforcing members 3j at the intersecting portions between the first reinforcing members 3h and the second reinforcing members 3i of the reinforcing sections 3. It is possible to enhance the stability of the second reinforcing members 3i. When the etching is performed from the both surfaces of the mask base material 10a in the same manner as in the first embodiment, it is possible to form the recesses 4 at the portions of the first reinforcing members 3h and the second reinforcing members 3i to cover the through-holes.

The wiring pattern of the mask is described in the second embodiment by way of example. There is no limitation thereto. For example, it is possible to make the application to various wiring patterns as described in the first embodiment. When the strengths of the first reinforcing members 3h and the second reinforcing members 3i are sufficiently strong, it is also allowable to provide no third reinforcing member 3j. In this case, it is also appropriate to simultaneously form the first reinforcing members 3h and the second reinforcing members 3i in the second guide pattern-forming step and the second etching step as described in the first embodiment.

Figure 21:
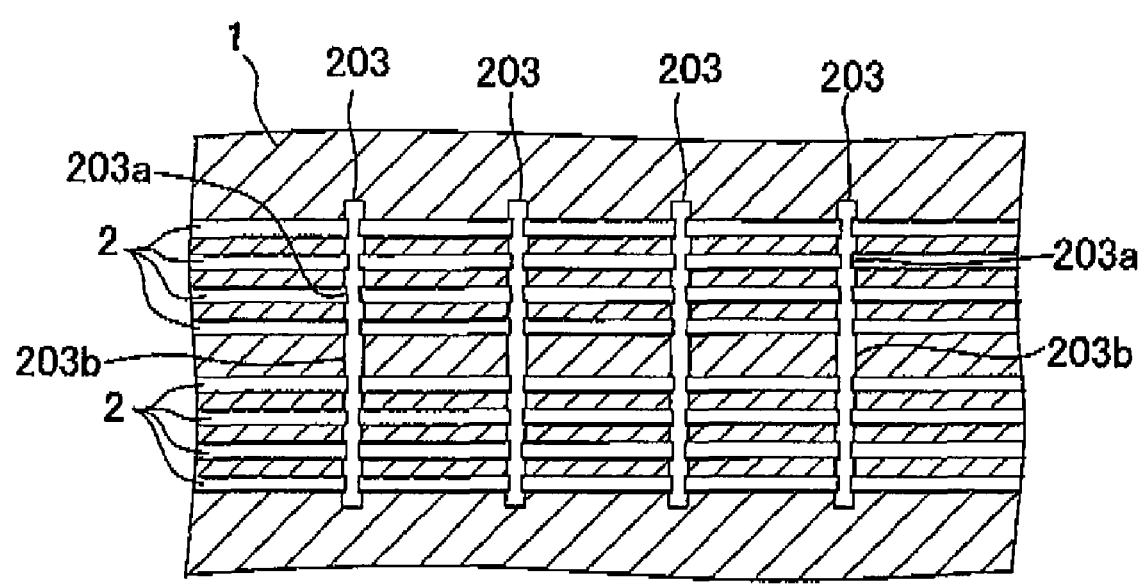
FIG. 21 shows a plan view illustrating a mask provided with reinforcing sections having different widths.

In the embodiments described above, the reinforcing section is constructed with the bar-shaped member having the constant width. However, as shown in FIG. 21, a portion 203a of a reinforcing section 203, which is overlapped with the through-hole 2 formed through the mask body as viewed in a plan view, may have a width which is smaller than a width of another portion 203b. When the reinforcing section 203 has the shape as described above, the metal, which is subjected to the sputtering, easily makes the detour to arrive at the area shadowed by the reinforcing section on the board, when the metal wiring is formed, for example, by means of the sputtering method on the board by utilizing the mask.

In the embodiments described above, the cross-sectional shape of the recess formed for the reinforcing section is substantially rectangular. However, for example, the cross-sectional shape may be an arbitrary shape including, for example, semicircular shapes.

What is claimed is:

1. A mask comprising a flat plate-shaped mask body which is formed with a plurality of through-holes, and a reinforcing section which is arranged on one surface of the mask body so as to straddle over the through-holes and which reinforces the mask body, wherein:
   a length between a surface of the mask body on a side opposite to the one surface of the mask body and a surface of the reinforcing section facing the through-holes is longer than a thickness of the mask body,
   wherein the plurality of the through holes formed in the mask body are a plurality of aligned linear through-holes;
   the reinforcing section includes a first reinforcing member which is arranged so as to straddle over the plurality of through-holes, and a second reinforcing member which is arranged to intersect the first reinforcing member;
   the second reinforcing member is extended in a direction that is substantially parallel to the linear through-holes and is arranged in an area substantially overlapped with and aligned in a same direction as the linear through-holes in a plan view; and
   a portion, at which the first reinforcing member and the second reinforcing member intersect with each other, is formed to be thicker than other portions of the first reinforcing member and the second reinforcing member.

2. The mask according to claim 1, wherein the reinforcing section has a recess which is formed at a portion of the reinforcing section which covers an opening of each of the through-holes, and an area, which is defined by the recess, is communicated with the through-holes.

3. The mask according to claim 2, wherein the recess is formed over an area overlapped with the through-holes, and an inner surface of the recess and an inner surface of the mask body defined by one of the through-holes are continuous.

4. The mask according to claim 1, wherein the mask body and the reinforcing section are composed of silicon or a compound containing silicon.

5. The mask according to claim 1, wherein the mask body and the reinforcing section are formed as an integrated body.

6. The mask according to claim 1, wherein:
   the plurality of the through holes formed in the mask body is a plurality of aligned linear through-holes; and
   the reinforcing section is arranged so as to straddle over the plurality of through-holes.

7. The mask according to claim 1, wherein the reinforcing section has a slender shape, and a portion of the reinforcing section, which is overlapped with the through-holes, has a width smaller than a width of a portion of the reinforcing section not overlapped with the through-holes.

8. The mask according to claim 1, wherein:
   an island portion is provided in each of the through-holes formed through the mask body; and
   the reinforcing section is arranged to straddle over the through-holes and connect the mask body and the island portion of each of the through holes.

9. A method for producing a wired board by forming a wiring on a board by using the mask as defined in claim 1, the method comprising:
   a positioning step of positioning the mask so that the other surface of the mask faces the board; and
   a wiring-forming step of forming the wiring on the board by sending material particles for forming the wiring from a side of the one surface of the mask toward the board.

10. The mask according to claim 1, wherein the mask body is provided with a plurality of through-holes each of which is formed with a first portion, a second portion, and a bent portion, wherein the first portion and the second portion are polygonal and line-shaped, and a corner is formed in the bent portion at an intersection between the first portion and the second portion;

each first portion of the plurality of through-holes is substantially parallel to other first portions of the plurality of through-holes, each second portion of the plurality of through-holes is substantially parallel to other second portions of the plurality of through-holes, and each corner of the plurality of through-holes is substantially aligned with other corners of the plurality of through-holes; and the reinforcing section straddles over the substantially bent corners of each of the plurality of through-holes.

11. A method for producing a mask including a flat plate-shaped mask body which is formed with a plurality of through-holes, and a reinforcing section which is arranged so as to straddle over the through-holes and which reinforces the mask body, the method comprising:

a step of providing a flat plate-shaped mask base material;

a first guide pattern-forming step of forming, on one surface of the mask base material, a first guide pattern for forming the through-holes;

a first etching step of performing etching, in accordance with the first guide pattern, for a portion of the one surface of the mask base material on which the first guide pattern has been formed, such that no penetration is caused through the mask base material;

a second guide pattern-forming step of forming, on the other surface of the mask base material, a second guide pattern for forming the reinforcing section; and a second etching step of performing etching, for the other surface of the mask base material except for an area in which the reinforcing section is to be formed, in accordance with the second guide pattern on the other surface, such that penetration is caused through the portion of the one surface having been subjected to the etching in the first etching step, wherein the plurality of the through-holes formed in the mask body are a plurality of aligned linear through-holes;

the reinforcing section includes a first reinforcing member which is arranged so as to straddle over the plurality of through-holes, and a second reinforcing member which is arranged to intersect the first reinforcing member;

the second reinforcing member is extended in a direction that is substantially parallel to the linear through-holes and is arranged in an area substantially overlapped with and aligned in a same direction as the linear through-holes in a plan view; and a portion, at which the first reinforcing member and the second reinforcing member intersect with each other, is formed to be thicker than other portions of the first reinforcing member and the second reinforcing member.

12. The method for producing the mask according to claim 11, wherein a total of etching depths effected in the first etching step and the second etching step is greater than a thickness of the mask base material.

13. The method for producing the mask according to claim 11, wherein each of the etching performed in the first etching step and the etching performed in the second etching step is anisotropic etching.

14. The method for producing the mask according to claim 11, wherein the second guide pattern-forming step includes a step of forming a first reinforcing member pattern for forming a first reinforcing member of the reinforcing section and a step of forming a second reinforcing member pattern for forming a second reinforcing member of the reinforcing section; and the second guide pattern-forming step further includes an etching step of performing etching on the one surface of the mask base material, on which the first reinforcing member pattern has been formed, in accordance with the first reinforcing member pattern such that no penetration is caused through the mask base material, the etching step being performed between the step of forming the first reinforcing member pattern and the step of forming the second reinforcing member pattern.

15. The method for producing the mask according to claim 14, wherein the first reinforcing member pattern and the second reinforcing member pattern intersect with each other.

16. The method for producing the mask according to claim 15, wherein the second guide pattern-forming step further includes a step of forming a third reinforcing member pattern for forming a third reinforcing member of the reinforcing section; and the second guide pattern-forming step further includes an etching step of performing etching on the other surface of the mask base material, on which the second reinforcing member pattern has been formed, in accordance with the second reinforcing member pattern such that no penetration is caused through the mask base material, the etching step being provided between the step of forming the second reinforcing member pattern and the step of forming the third reinforcing member pattern.

17. The method for producing the mask according to claim 11, further comprising a mask area-forming step of forming a mask area for forming the plurality of through-holes by performing etching on the mask base material, the mask area-forming step being performed at least before performing the second guide pattern-forming step.

18. The method for producing the wired board according to claim 9, further comprising a removing step of removing the material particles deposited on the surface of the mask.

\* \* \* \* \*